(12) United States Patent
Kawata et al.

(10) Patent No.: US 9,780,773 B2
(45) Date of Patent: Oct. 3, 2017

(54) LOAD DRIVE CONTROL DEVICE

(71) Applicant: Hitachi Automotive Systems, Ltd., Hitachinaka-shi, Ibaraki (JP)

(72) Inventors: Takahiro Kawata, Hitachinaka (JP); Ryoichi Oura, Hitachinaka (JP); Masahito Sonehara, Hitachinaka (JP); Yoshitaka Abe, Hitachinaka (JP); Takeo Yamashita, Tokyo (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 14/769,295

(22) PCT Filed: Dec. 13, 2013

(86) PCT No.: PCT/JP2013/083410
§ 371 (c)(1),
(2) Date: Aug. 20, 2015

(87) PCT Pub. No.: WO2014/132523
PCT Pub. Date: Sep. 4, 2014

(65) Prior Publication Data
US 2015/0381159 A1 Dec. 31, 2015

(30) Foreign Application Priority Data

Feb. 28, 2013 (JP) .................................. 2013-038121

(51) Int. Cl.
*H03B 1/00* (2006.01)
*H03K 17/16* (2006.01)
(Continued)

(52) U.S. Cl.
CPC .............. *H03K 17/16* (2013.01); *H03K 3/012* (2013.01); *H03K 3/013* (2013.01); *H03K 17/08* (2013.01);
(Continued)

(58) Field of Classification Search
CPC ...... H03F 3/245; H03F 1/0227; H03F 1/0277; H03F 2200/336; H03F 2200/451
See application file for complete search history.

(56) References Cited

U.S. PATENT DOCUMENTS 6,222,403 B1 4/2001 Mitsuda
6,407,594 B1 6/2002 Milazzo et al.
(Continued)

FOREIGN PATENT DOCUMENTS

JP 7-22851 A 1/1995
JP 11-346147 A 12/1999
(Continued)

OTHER PUBLICATIONS

International Search Report dated Apr. 1, 2014, with English translation (Seven (7) pages).
(Continued)

*Primary Examiner* — Sibin Chen
(74) *Attorney, Agent, or Firm* — Crowell & Moring LLP

(57) ABSTRACT

Provided is a load drive slope control device that can reduce EMI noise, and power loss and heat generation when a drive transistor is turned on and off, and can prevent excessive high temperature-induced damage to the drive transistor at an excessive high temperature. Disclosed is a load drive control device including: a drive transistor that drives a load; a pre-driver that drives the drive transistor via an ON/OFF control terminal of the drive transistor; a capacitor that is connected to an input side of the pre-driver, a first current source that is ON/OFF controlled by a first signal, and generates current which is charged to the capacitor; and a second current source that is ON/OFF controlled by a second signal, and generates current for discharging the capacitor, in which an output voltage from the pre-driver is changed by charging or discharging the capacitor, the drive transistor is turned on and off by the output voltage from the pre-driver, and a linear ascending gradient and a linear descending gradient of the waveform of a voltage driving (Continued)

the load are obtained by turning on and off the drive transistor.

14 Claims, 30 Drawing Sheets

(51) Int. Cl.
 *H03K 17/08* (2006.01)
 *H03K 3/012* (2006.01)
 *H03K 3/013* (2006.01)

(52) U.S. Cl.
 CPC ... *H03K 17/164* (2013.01); *H03K 2017/0806* (2013.01)

(56) References Cited

U.S. PATENT DOCUMENTS

| | | | | |
|---|---|---|---|---|
| 2003/0034941 | A1* | 2/2003 | Janssen | G09G 3/006 345/87 |
| 2006/0267665 | A1 | 11/2006 | Kawamoto | |
| 2008/0143697 | A1 | 6/2008 | Kojima | |
| 2011/0175650 | A1 | 7/2011 | Tumminaro et al. | |
| 2011/0241738 | A1* | 10/2011 | Tamaoka | H02M 1/08 327/109 |

FOREIGN PATENT DOCUMENTS

| | | |
|---|---|---|
| JP | 2007-13916 A | 1/2007 |
| JP | 2011-142643 A | 7/2011 |
| JP | 2012-15946 A | 1/2012 |

OTHER PUBLICATIONS

Shigeo, "EMC and basic technology", Kougakutosho Ltd., 1996, (Three (3) pages).

* cited by examiner

LOAD DRIVE CONTROL DEVICE

TECHNICAL FIELD

The present invention relates to a load drive control device, particularly, to a load drive slope control device that controls an ascending time and a descending time for the waveform of a voltage driving a load.

BACKGROUND ART

When a drive transistor, which is connected to a load so as to drive the load (for example, a solenoid), is turned on and off for pulse width modulation (PWM) control such that the load is driven, electromagnetic inference (EMI) noise occurs due to high-frequency components of an output voltage from the drive transistor.

For this reason, EMI noise is reduced by sufficiently ensuring an ascending time and a descending time (hereinafter, also referred to as a gradient or a slope) for the waveform of a voltage driving a load via the charging or the discharging of the capacitance of an ON/OFF control terminal (for example, a gate terminal of a drive MOS transistor) of the drive transistor for driving the load with a current source (For example, PTL 1). Typically, a relationship between a voltage waveform and a frequency spectrum is used as electromagnetic compatibility (EMC) technology (For example, NPL 1).

With respect to a voltage waveform in which trapezoidal waves with a period T, a pulse width Pw, an ascending time tr, a descending time tf, and an amplitude A are repeated as illustrated in FIG. 4 (*a*), when tr is equal to tf, as illustrated in FIG. 4(*b*), a high-frequency spectrum with a fundamental frequency of 1/T forms an envelope curve.

In FIG. 4(*b*), since the number of high-frequency components is small in a frequency region from a low frequency to a frequency of f1=1/(πPw), a frequency characteristic is approximately flat, and in a frequency region from a frequency of f1=1/(πPw) to a frequency of f2=1/(πtr), high-frequency components decrease at a ratio of −20 dB/decade when the frequency increases. In a frequency region from a frequency that is higher than or equal to f2=1/(πtr), high-frequency components decrease at a ratio of −40 dB/decade when the frequency increases.

From the relationship between the voltage waveform and the frequency spectrum, it is understood that an increase in the ascending time and the descending time for a signal waveform is effective in reducing the frequency spectrum in the high-frequency region. When tr is not equal to tf, f2 is mainly determined by small values of the ascending time tr and the descending time tf.

CITATION LIST

Patent Literature

PTL 1: US Patent Publication No. 2011/0175650

Non Patent Literature

NPL 1: page 18 of "EMC and basic technology" written by Suzuki Shigeo and published by Kougakutosho Ltd. in 1996

SUMMARY OF INVENTION

Technical Problem

With regard to an example of the EMI noise reduction method in the related art as illustrated in FIG. 2, a case in which a load 2 (herein, a solenoid or an inductor) is driven by a high-side drive NMOS transistor 7 connected to a high-voltage power supply VB will be described (For example, refer to FIG. 1B in PTL 1).

In response to the turning on of an input signal INH, a current source control unit 3 turns on a current source I1 that is ON/OFF controlled by a signal S1, and a current source I2 that is ON/OFF controlled by a signal S2, the gate capacitance of the high-side drive NMOS transistor 7 is charged, and a gate-to-source voltage is increased to exceed the threshold voltage of the high-side drive NMOS transistor 7, and thus the high-side drive NMOS transistor 7 is turned on.

In response to the turning off of the input signal INH, the current source control unit 3 turns off the current source I1 via the signal S1, and turns on the current source I2 via the signal S2, the gate capacitance of the high-side drive NMOS transistor 7 is discharged, and the gate-to-source voltage is decreased to a level which is less than the threshold voltage of the high-side drive NMOS transistor 7, and thus the high-side drive NMOS transistor 7 is turned off.

When the high-side drive NMOS transistor 7 is turned on and off, it is possible to sufficiently ensure the ascending time and the descending time for the waveform of a voltage driving the load by decreasing the current value of the current source I1 and the current source I2 to which the gate capacitance of the high-side drive NMOS transistor 7 is charged.

However, typically, the gate-to-drain voltage dependency and the gate-to-source voltage dependency of the gate capacitance of the high-side drive NMOS transistor 7 are non-linear. For this reason, when the high-side drive NMOS transistor 7 is turned on and off, a region with a small gradient may occur in the waveform of the voltage driving the load.

The region with a small gradient in the waveform of the voltage driving the load does not make a contribution to a reduction in f2 frequency in FIG. 4(*b*), and is not effective in reducing a frequency spectrum in the high-frequency region of EMI noise. In contrast, there is a problem in that power loss and heat generation are increased.

FIG. 3 illustrates an example of a timing chart for the drive of a load in the related art in FIG. 2. Power loss PdH when the high-side drive NMOS transistor 7 is turned on and off is obtained by multiplying output current IOUTH of the high-side drive NMOS transistor 7 by a drain-to-source voltage VDSH, and a region with a small gradient occurs in the waveform of the voltage OUT driving a load, and thus the power loss PdH is increased, and as a result, heat generation is increased, which is a problem.

The present invention is to provide a load drive slope control device that can reduce EMI noise, and power loss and heat generation when a drive transistor is turned on and off.

There is a problem in that when an ascending time and a descending time for the waveform of a voltage driving a load are sufficiently ensured in order to reduce EMI noise, power loss and heat generation when the drive transistor is turned on and off increase, and particularly, thermal destruction due to heat generation may occur in a device in which load drivers for multiple channels are integrated.

The present invention provides a load drive slope control device that can reduce EMI noise when temperature is not excessively high, and protect a drive transistor from excessive high temperature-induced damage at an excessive high temperature.

Solution to Problem

In order to solve the above problem, according to the present invention, there is provided a load drive control device including a drive transistor that drives a load, a pre-driver that drives the drive transistor via an ON/OFF control terminal of the drive transistor, a capacitor that is connected to an input side of the pre-driver, a first current source that is ON/OFF controlled by a first signal, and generates current which is charged to the capacitor and a second current source that is ON/OFF controlled by a second signal, and generates current for discharging the capacitor, in which an output voltage from the pre-driver is changed by charging or discharging the capacitor, the drive transistor is turned on and off by the output voltage from the pre-driver, and a linear ascending gradient and a linear descending gradient of the waveform of a voltage driving the load are obtained by turning on and off the drive transistor.

Advantageous Effects of Invention

According to the present invention, it is possible to provide a load drive slope control device that can reduce EMI noise, and power loss and heat generation when a drive transistor is turned on and off.

In addition, it is possible to provide a load drive slope control device that can reduce EMI noise when temperature is not excessively high, and protect a drive transistor from excessive high temperature-induced damage.

Tasks, configuration, and effects which have not been described above are apparent from embodiments to be described hereinbelow.

DESCRIPTION OF EMBODIMENTS

Hereinafter, embodiments of the present invention will be described with reference to the accompanying drawings. Since the drawings schematically illustrate the present invention, the technical scope of the present invention is required not to be narrowly interpreted based on the drawings. The same reference signs will be assigned to the same elements, and descriptions thereof will be omitted.

First Embodiment

The configuration and the operation of a load drive slope control device 1 in a first embodiment of the present invention, which can reduce EMI noise, and reduce power loss and heat generation when a drive transistor is turned on and off, will be described.

Figure 1:
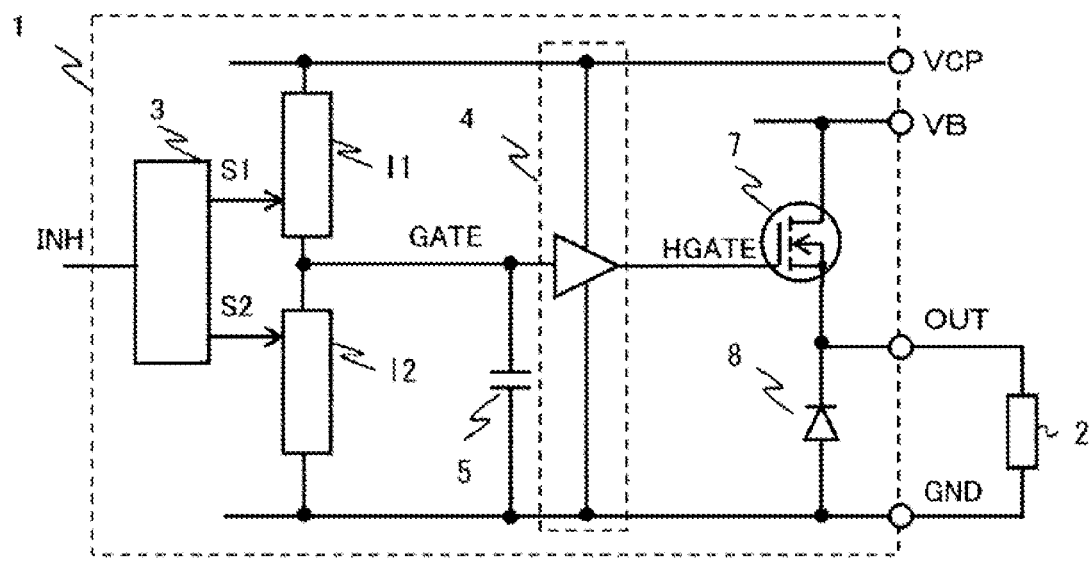
FIG. 1 is a block diagram illustrating the configuration of a load drive slope control device in a first embodiment of the present invention.

FIG. 1 illustrates the entire configuration of the load drive slope control device 1 in the first embodiment of the present invention which uses a high-side drive NMOS transistor.

The load drive slope control device 1 in FIG. 1 includes a power supply terminal VB; a load 2 which is a drive target; a high-side drive NMOS transistor 7 that is connected across the power supply terminal VB and the load 2; a pre-driver 4 that drives the gate of the high-side drive transistor 7; a capacitor 5 that is connected to an input GATE of the pre-driver 4; a first current source I1 that is ON/OFF controlled by a first signal S1, and generates current which is charged to the capacitor 5 connected to the input GATE of the pre-driver 4; and a second current source I2 that is ON/OFF controlled by a second signal S2, and generates current for discharging the capacitor 5 connected to the input GATE of the pre-driver 4.

In response to the turning on of an input signal INH, a current source control unit 3 turns on the current source I1 that is ON/OFF controlled by the signal S1, and turns off the current source I2 that is ON/OFF controlled by the signal S2.

Figure 6A:
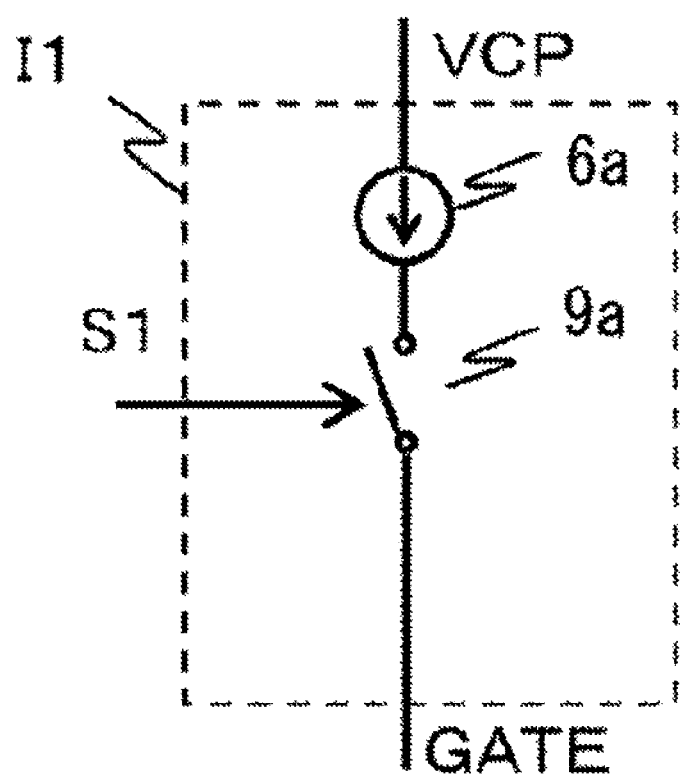
FIG. 6A is an example of a current source in the example illustrated in FIG. 1.
Figure 6B:
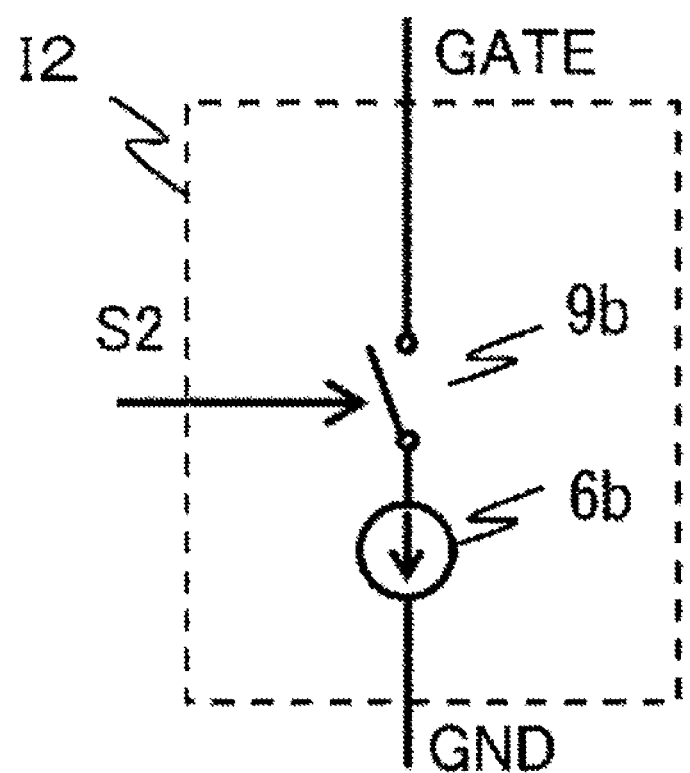
FIG. 6B is an example of a current source in the example illustrated in FIG. 1.

For example, as illustrated in FIG. 6(a), the current source I1 is configured to include a constant current source 6a and a switch 9a that is ON/OFF controlled by the signal S1. For example, as illustrated in FIG. 6(b), the current source I2 is configured to include a constant current source 6b and a switch 9b that is ON/OFF controlled by the signal S2. Each of the switches 9a and 9b is formed by an analog switch circuit, or the like.

Figure 6C:
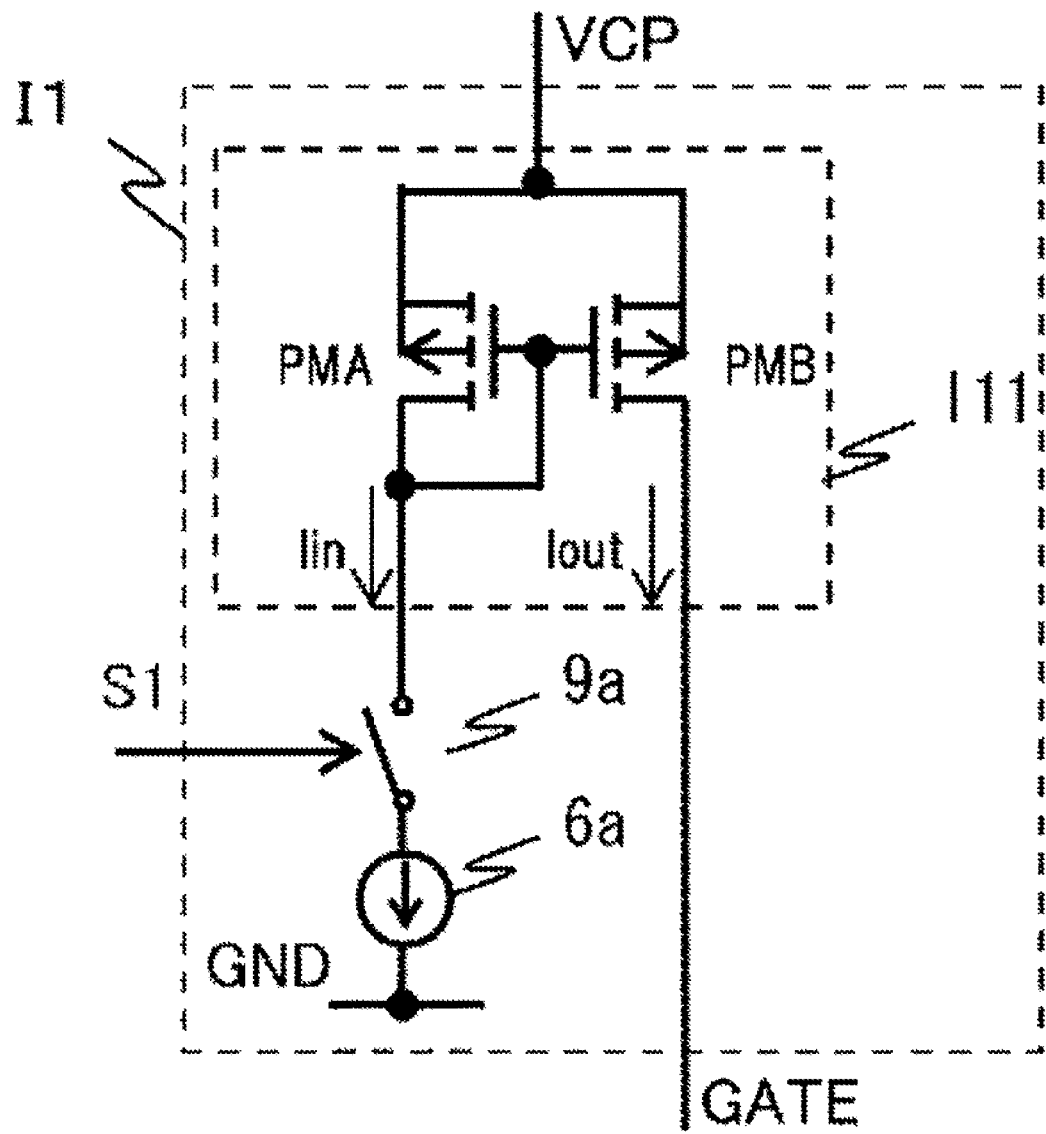
FIG. 6C is another example of the current source in the example illustrated in FIG. 1.

As in the current source I1 illustrated in FIG. 6(c) as an example, each of the current sources I1 and I2 may be configured to include the constant current source 6a, the switch 9a that is ON/OFF controlled by the signal S1, and a current copy circuit 111. The current copy circuit 111 as an example is formed by a current mirror circuit configured to include a PMA and PMB which are PMOS transistors.

When the capacitor 5 connected to the input GATE of the pre-driver 4 is charged to a current value of Is1, the ascending gradient of the input GATE voltage of the pre-driver becomes Is1/C. An element with a capacitance value of C and voltage dependence lower than the voltage dependence of the gate capacitance of the high-side drive NMOS transistor is used as the capacitor 5.

Figure 5A:
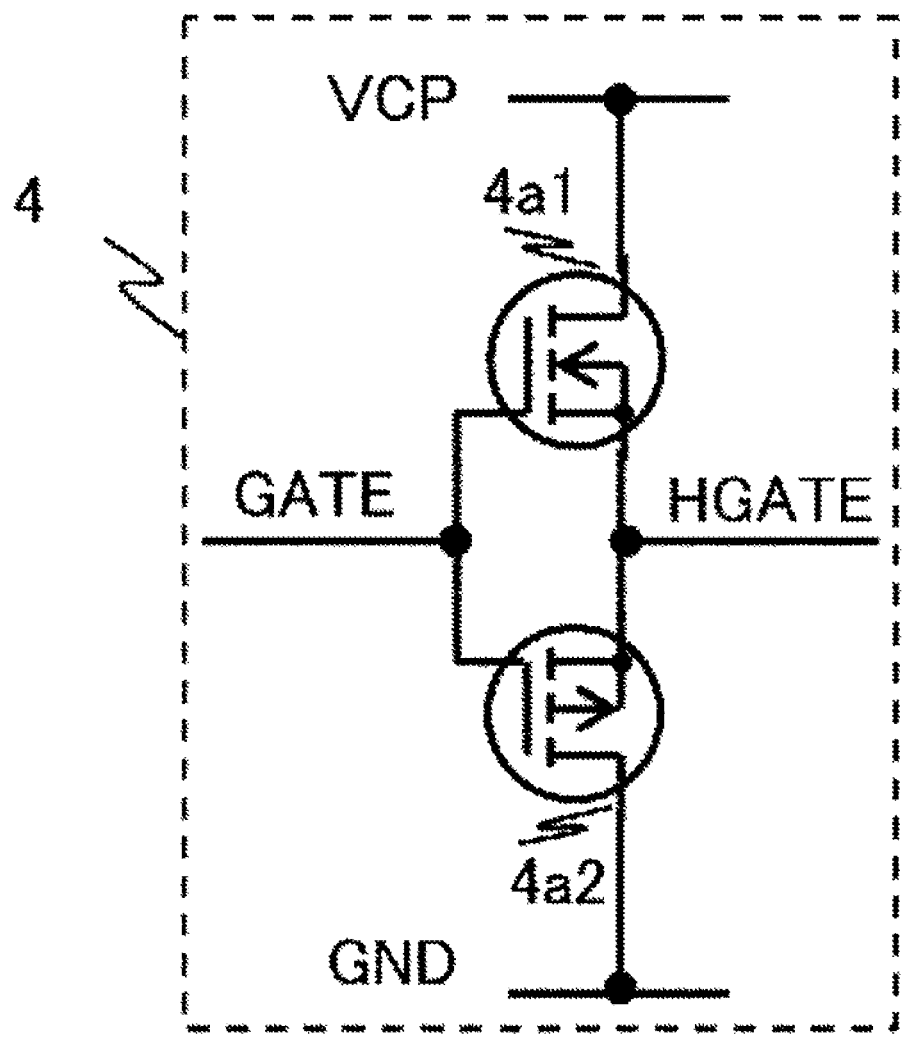
FIG. 5A is an example of a pre-driver circuit in the example illustrated in FIG. 1.
Figure 5B:
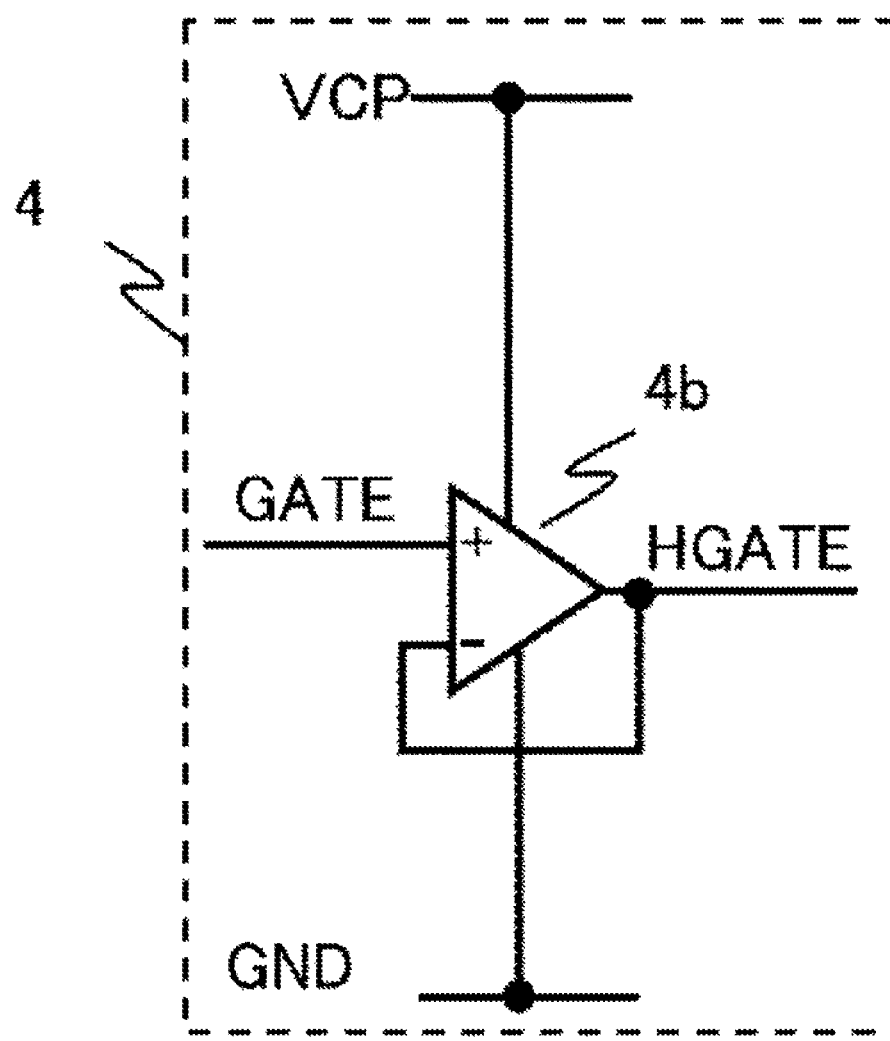
FIG. 5B is another example of the pre-driver circuit in the example illustrated in FIG. 1.

The pre-driver 4 has a characteristic such that the input GATE voltage and an output HGATE voltage have a linear relationship. In a case to be described hereinbelow, for example, the pre-driver 4 has a gain of 1, and has a voltage follower circuit that is formed by a source follower circuit, or an operational amplifier configured to include an N-type transistor and a P-type transistor as illustrated in FIGS. 5(a) and 5(b).

In this case, the ascending gradient of the output HGATE voltage of the pre-driver 4 becomes Is1/C, and the gate voltage of the high-side drive NMOS transistor 7 is controlled such that the high-side drive NMOS transistor 7 is turned on.

In response to the turning off of the input signal INH, the current source control unit 3 turns off the current source I1 via the signal S1, and turns on the current source I2 via the signal S2, and the capacitor 5 connected to the input GATE of the pre-driver 4 is discharged to a current value of Is2, and thus the gradients of the input GATE voltage and the output HGATE voltage of the pre-driver become −Is2/C. The gate voltage of the high-side drive NMOS transistor 7 is controlled such that the high-side drive NMOS transistor 7 is turned off.

Since the voltage of an output terminal OUT (which is connected to the load 2) of the high-side drive NMOS transistor 7 and the HGATE voltage (which is a gate voltage) are components of a source follower circuit or a grounded drain amplifier circuit, the gain is 1. When the high-side drive NMOS transistor 7 is turned on, the gradient of the output voltage OUT becomes Is1/C, and when the high-side drive NMOS transistor 7 is turned off, the gradient becomes Is2/C.

Figure 6D:
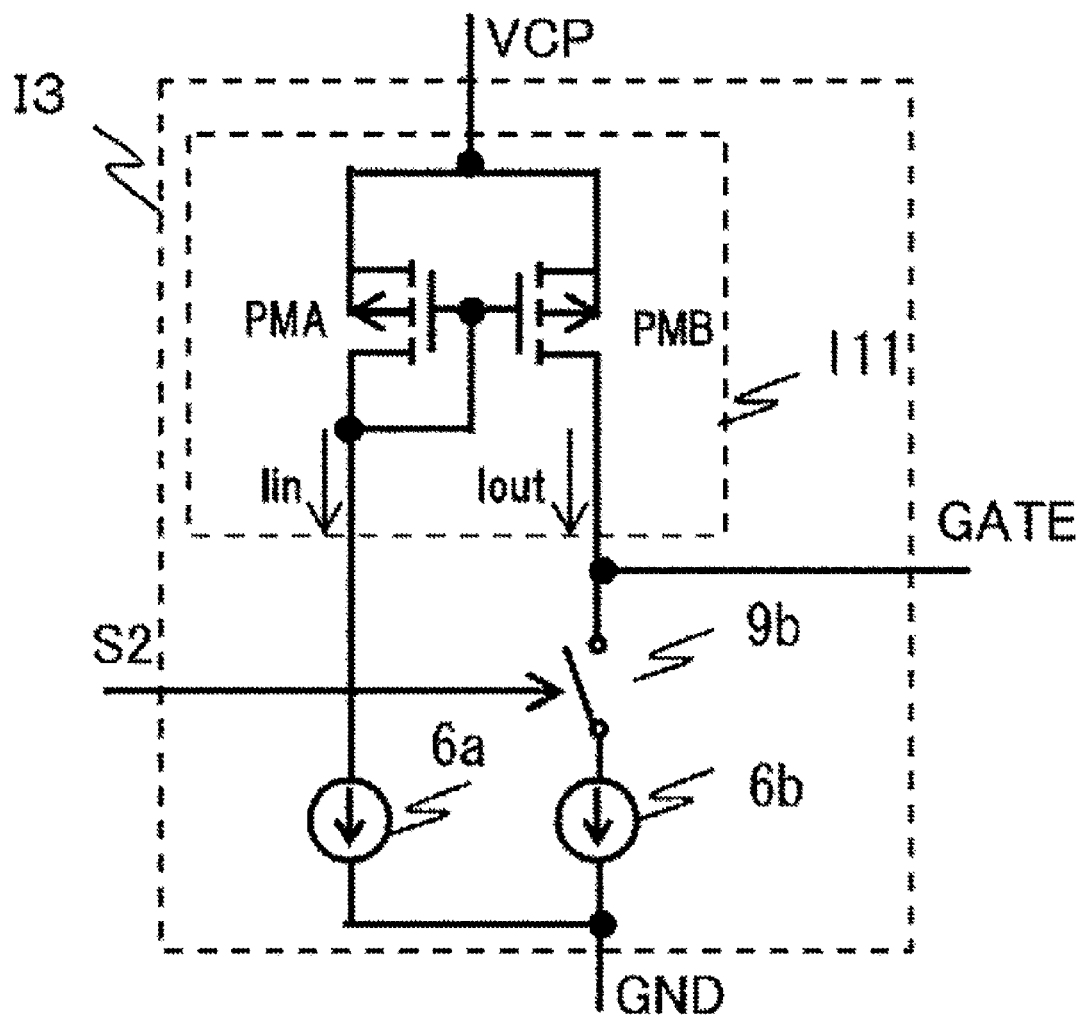
FIG. 6D is an example of a current source in the example illustrated in FIG. 1.
Figure 13:
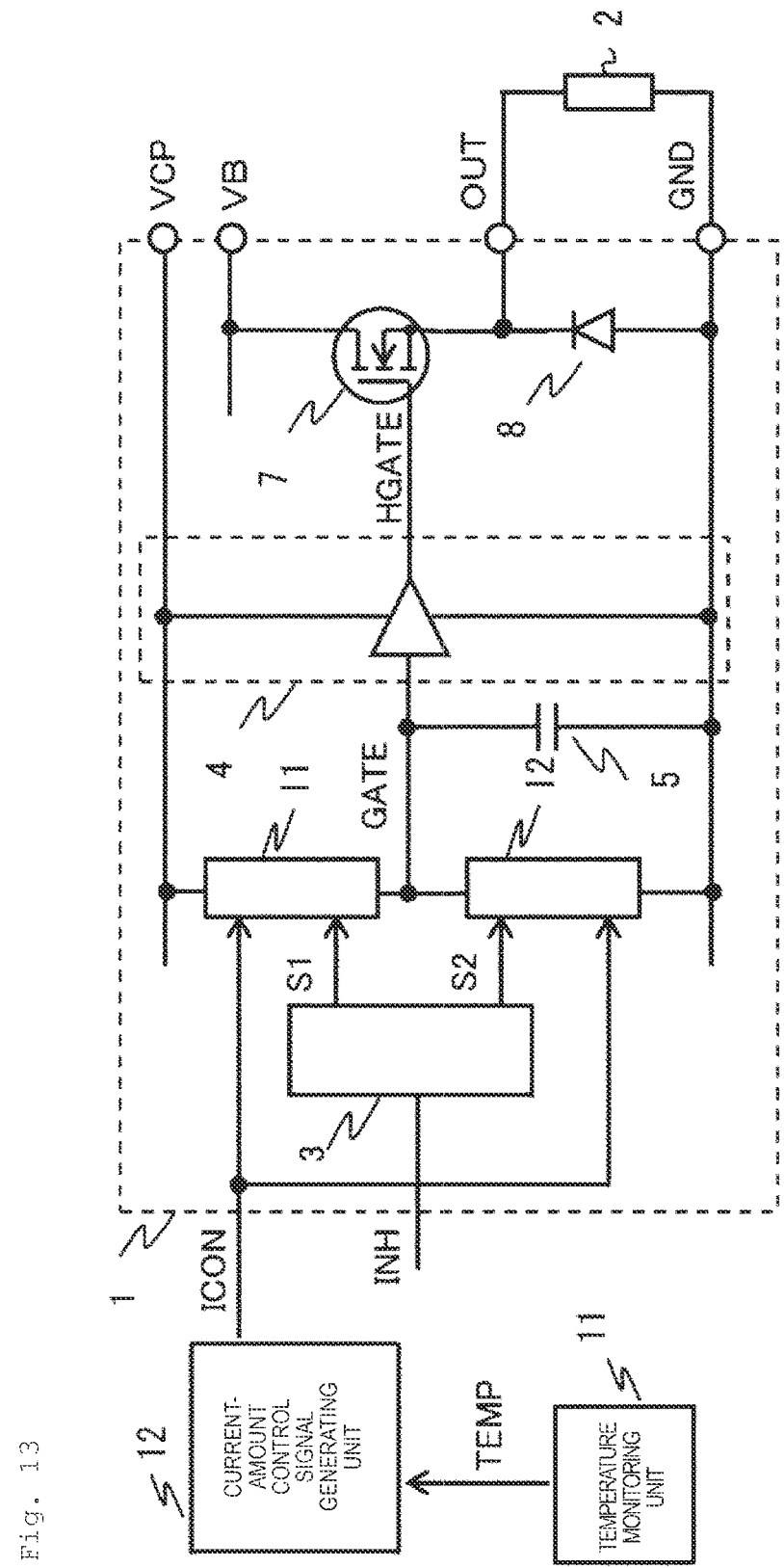
FIG. 13 is a block diagram illustrating the configuration of the load drive slop control device in a third embodiment of the present invention.

The current sources I1 and I2 can also be configured to output a single signal instead of the two signals S1 and S2. In an example illustrated in FIG. 6(d), 13 is configured to include the switch 9b that is ON/OFF controlled by the signal S2; the constant current source 6a with a current value of Is1; the constant current source 6b with a current value of Is2; and the current copy circuit 111, and Is1 is less than Is2. When the switch 9b is turned on, GATE is discharged to a current value of Is2−Is1, and when the switch 9b is turned off, GATE is charged to a current value of Is1.

In the first embodiment illustrated in FIG. 1, an operation when the load 2 is a solenoid or an inductor will be described with reference to a timing chart in FIG. 7(a).

In the timing chart given as an example in the embodiment, a period for which the input signal INH is turned on is referred to as a high-side ON period, and a period for which the input signal INH is turned off is referred to as a high-side OFF period.

During the high-side ON period, output current IOUTH flows from the high-side drive NMOS transistor 7 to the load 2, and thus when the effect of a leak current is ignored, an output terminal OUT voltage becomes a voltage that is obtained by subtracting the amount of an ON voltage VonH of the high-side drive NMOS transistor 7 from the power supply voltage VB. When the ON resistance of the high-side drive NMOS transistor 7 is RonH, and the drive current of the high-side drive NMOS transistor 7 is IH, the ON voltage VonH is equal to IH×RonH.

Since the source voltage of the high-side drive NMOS transistor 7 is the output terminal OUT voltage, when a threshold voltage of the high-side drive NMOS transistor 7 is Vthn, in a driver circuit configured to drive a large current, the ON resistance RonH is preferably low resistance, and the following expression is satisfied: IH×RonH<Vthn.

Accordingly, the HGATE voltage required to turn on the high-side drive NMOS transistor 7 satisfies the following expression: HGATE voltage=VB−VonH+Vthn=VB−IH×RonH+Vthn>VB. As a result, the HGATE voltage is required to be greater than or equal to the power supply voltage VB. A VCP voltage supplied to the pre-driver 4 outputting the HGATE voltage is also required to have an electric potential that is higher than the power supply voltage VB.

Figure 11:
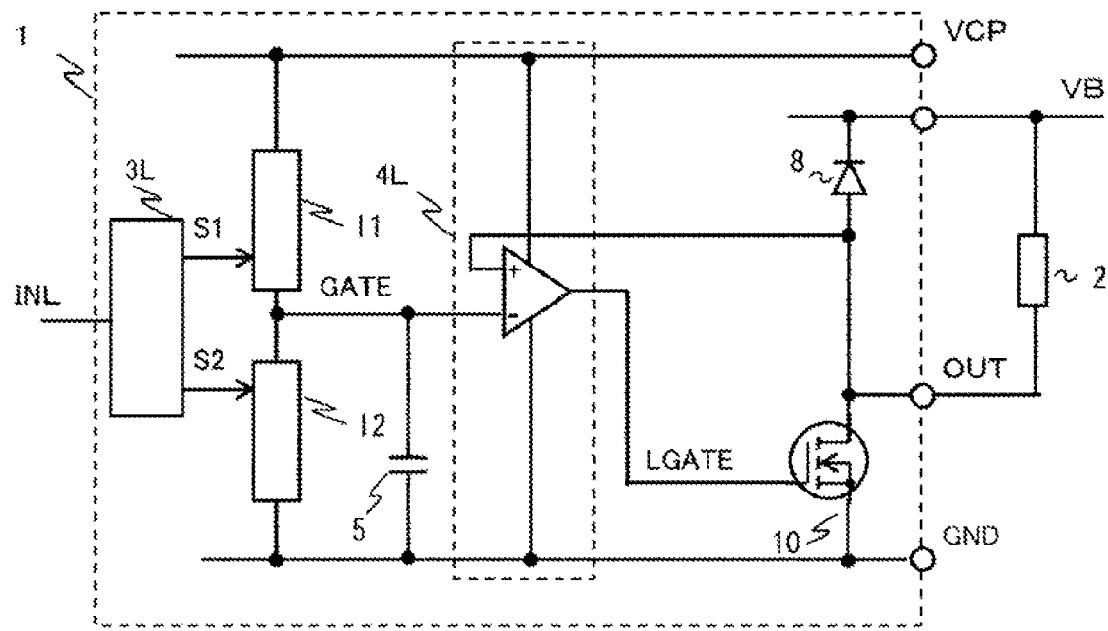
FIG. 11 is an example which is another form of the example illustrated in FIG. 9.

For example, the VCP voltage may be supplied via the terminal from an external power supply of the device as illustrated in FIG. 11, or may be generated from the power supply voltage VB by a charge pump, a DC-DC converter, a bootstrap, or the like which are not illustrated in the drawing.

When the high-side ON period transitions to the high-side OFF period, the high-side drive NMOS transistor 7 is turned off. At this time, a flyback voltage occurs across the load 2, and current flows from a GND terminal to the output terminal OUT due to a diode 8, and thus when the effect of a leak current is ignored, the output terminal OUT voltage becomes a voltage that is obtained by subtracting a forward voltage VOFF from the voltage at the GND terminal.

Since the gate-to-source voltage of the high-side drive NMOS transistor 7 depends on device characteristics in the range of a voltage which is less than or equal to the threshold voltage Vthn, the HGATE voltage required to completely turn off the high-side drive NMOS transistor 7 may satisfy the following expression: HGATE voltage=output terminal OUT voltage=−VOFF, which is not a prerequisite. At this time, the pre-driver 4 is desired to have the same reference potential as that of the output terminal OUT. In FIG. 1, the reference potential of the pre-driver 4 is the electric potential at the GND terminal.

Figure 7A:
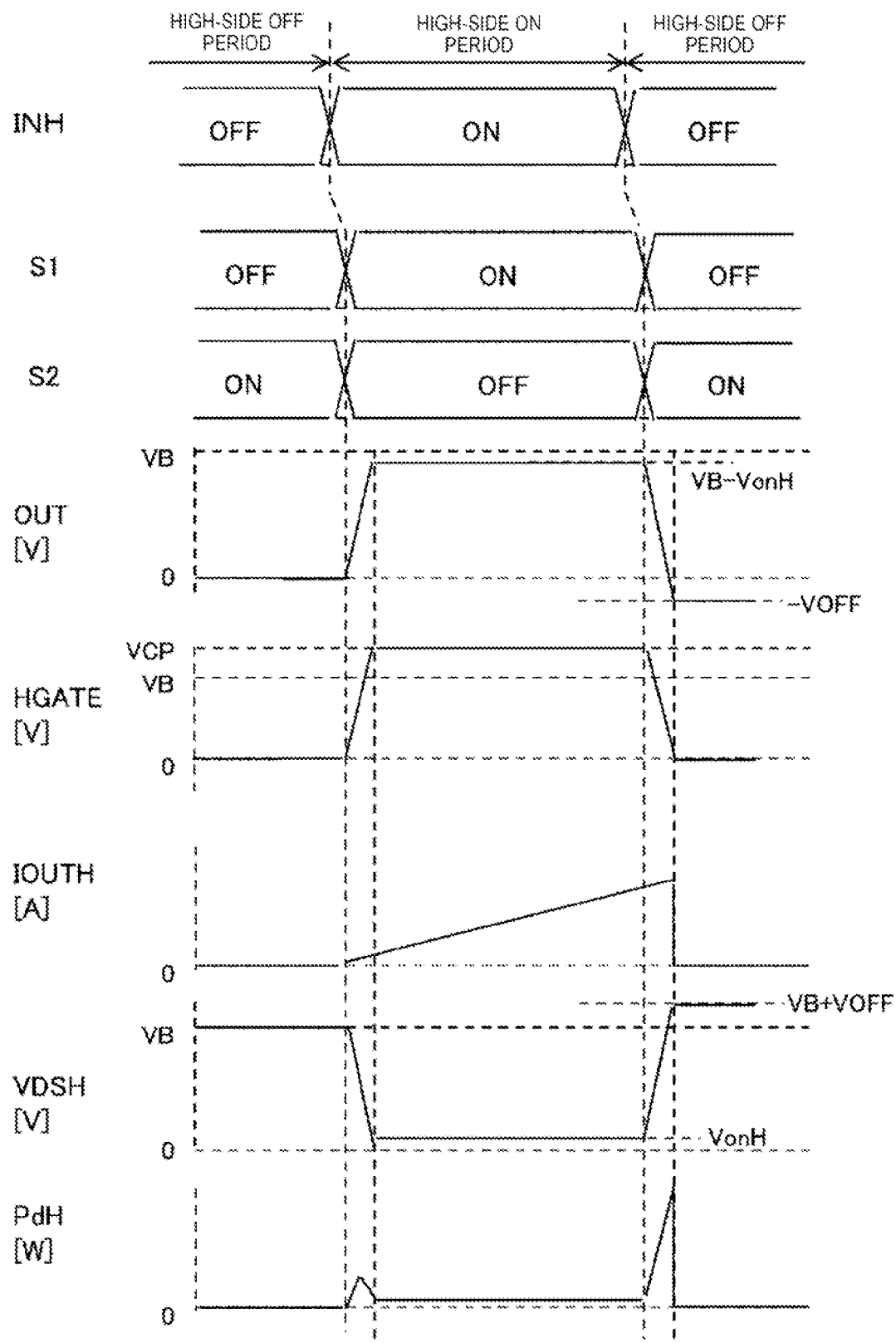
FIG. 7A is a timing chart in the example illustrated in FIG. 1.

The drain-to-source voltage waveform of the high-side drive NMOS transistor 7 has linear ascending and descending gradients as illustrated by VDSH in FIG. 7(a). Accordingly, power loss PdH (=IOUTH×VDSH) when the high-side drive NMOS transistor 7 is turned on and off can be reduced to the minimum amount of loss in a high-frequency characteristic of EMI noise which is characterized by f2 frequency in FIG. 4(b), and it is possible to prevent heat generation associated with power loss.

Figure 8:
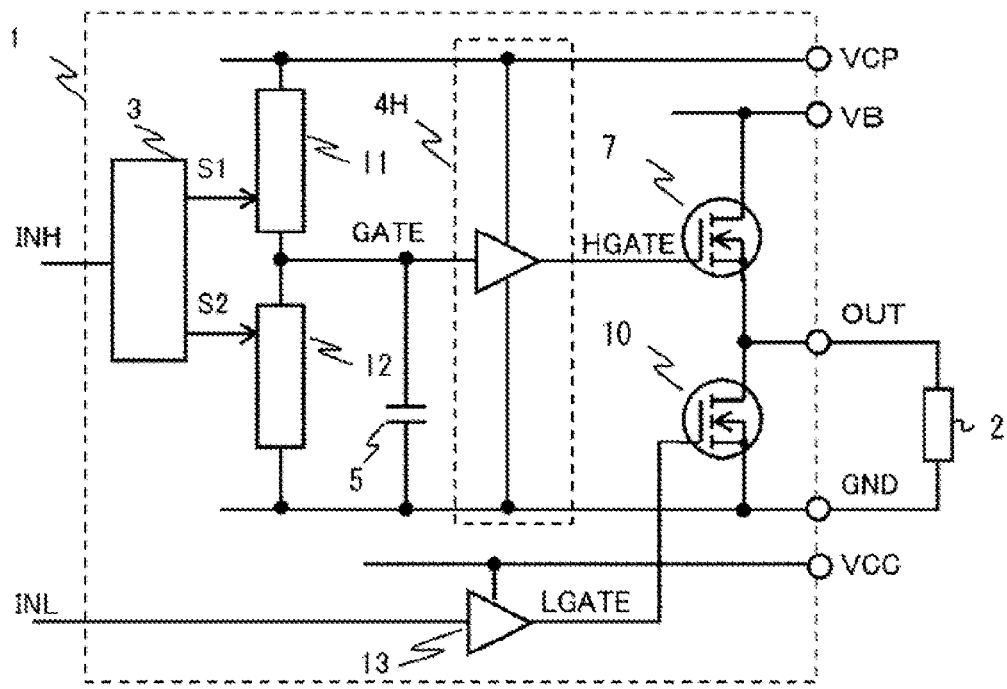
FIG. 8 is an example which is another form of the example illustrated in FIG. 1.

In the configuration illustrated in FIG. 1, a flyback voltage occurs across the load 2, and current flows from the GND terminal to the output terminal OUT due to the diode 8; however, a low-side drive NMOS transistor 10 performing synchronous rectification may be used without the diode 8 being installed as illustrated in FIG. 8. Herein, as an example, the gate of the low-side drive NMOS transistor 10 is configured to be turned on and off via a driver 13 in which the power supply voltage is VCC in response to an input signal INL being turned on and off.

Figure 7B:
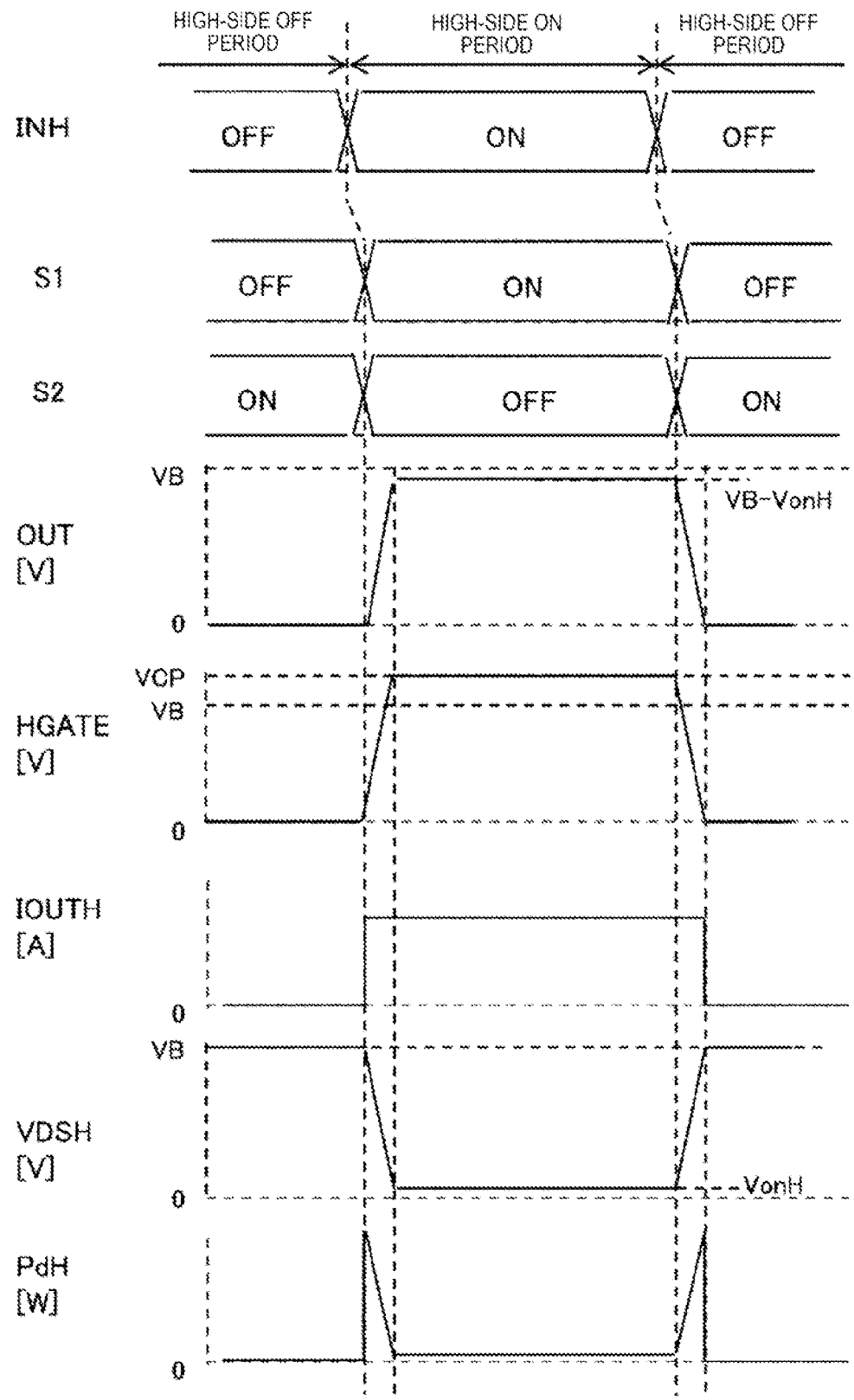
FIG. 7B is another timing chart in the example illustrated in FIG. 1.

In the first embodiment illustrated in FIG. 1, FIG. 7(b) illustrates an example of a timing chart when the load 2 is a resistance load.

Since the load 2 is a resistance load, when the high-side drive NMOS transistor 7 is turned off, a flyback voltage does not occur across the load 2. For this reason, the diode 8 in FIG. 1 is not necessary.

The drain-to-source voltage waveform of the high-side drive NMOS transistor 7 has linear ascending and descending gradients as illustrated by VDSH in FIG. 7(b). Accordingly, power loss PdH (=IOUTH×VDSH) when the high-side drive NMOS transistor 7 is turned on and off can be reduced to the minimum amount of loss in a high-frequency characteristic of EMI noise which is characterized by the f2 frequency in FIG. 4(b), and it is possible to prevent heat generation associated with power loss.

Figure 7C:
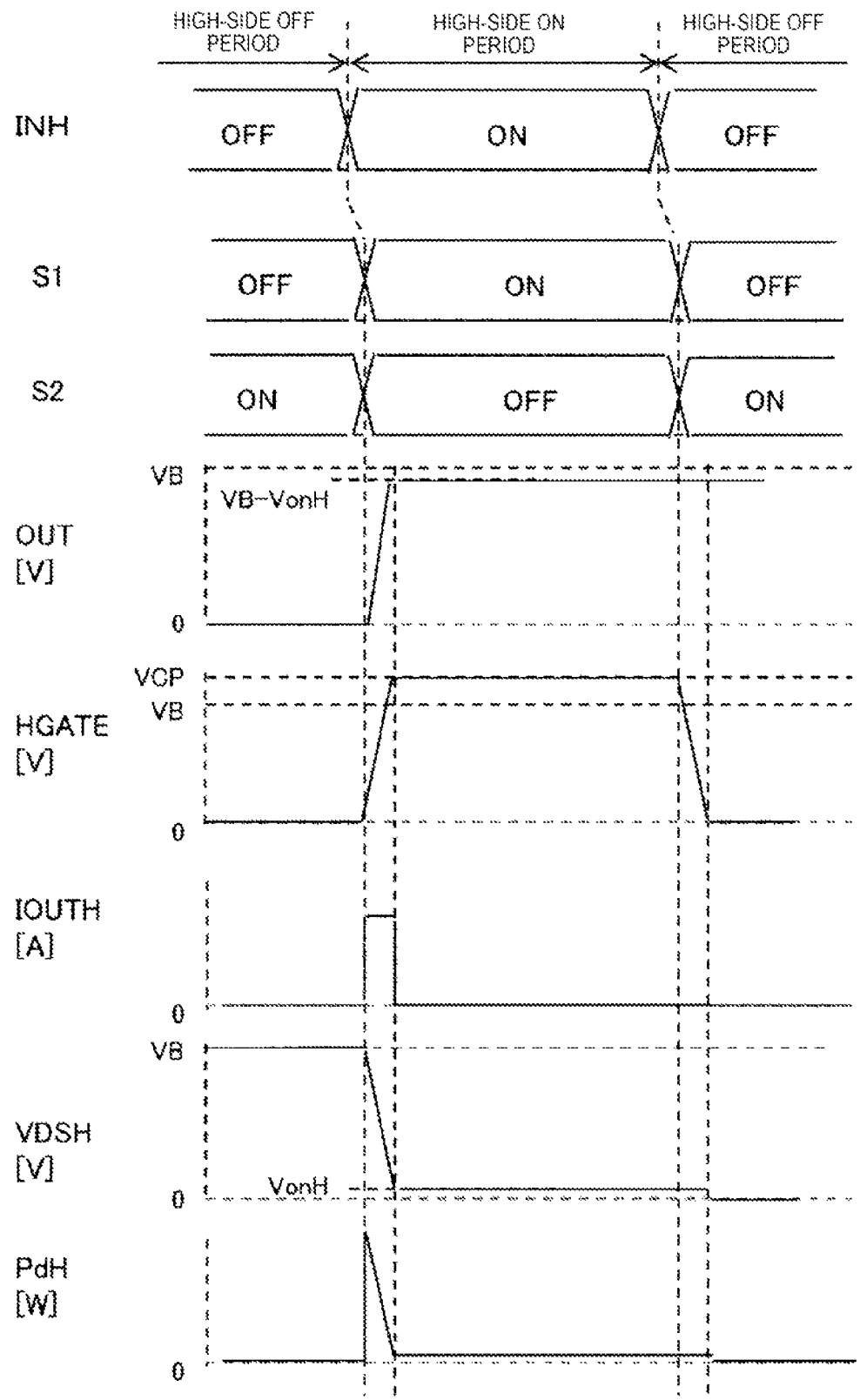
FIG. 7C is still another timing chart in the example illustrated in FIG. 1.

In the first embodiment illustrated in FIG. 1, FIG. 7(c) illustrates an example of a timing chart when the load 2 is a capacitor load.

Since the load 2 is a capacitor load, when the high-side drive NMOS transistor 7 is turned off, a flyback voltage does not occur across the load 2. For this reason, the diode 8 in FIG. 1 is not necessary. When the load 2 is charged, the output voltage OUT is not changed insofar as the load is not discharged.

When the load 2, that is, a capacitor load is not charged, the drain-to-source voltage waveform of the high-side drive NMOS transistor 7 has linear ascending and descending gradients as illustrated by VDSH in FIG. 7(c). Accordingly, power loss PdH (=IOUTH×VDSH) when the high-side drive NMOS transistor 7 is turned on can be reduced to the minimum amount of loss in a high-frequency characteristic of EMI noise which is characterized by the f2 frequency in FIG. 4(b), and it is possible to prevent heat generation associated with power loss. Herein, the output current of the high-side drive NMOS transistor 7 is IOUTH.

As such, for any one of the loads 2 described with reference to FIGS. 7(a) to 7(c), the load drive slope control device can reduce EMI noise, and reduce power loss and heat generation when the drive transistor is turned on and off. The load 2 may be a combination of a solenoid, an inductor, a resistor, and a capacitor.

Second Embodiment

In a load drive slope control device in a second embodiment of the present invention which can reduce EMI noise, and reduce power loss and heat generation when a drive transistor is turned on and off, the configuration and the operation of the load drive slope control device with a low-side drive transistor configured to be connected to the GND terminal and to drive the load 2 will be described.

Figure 9:
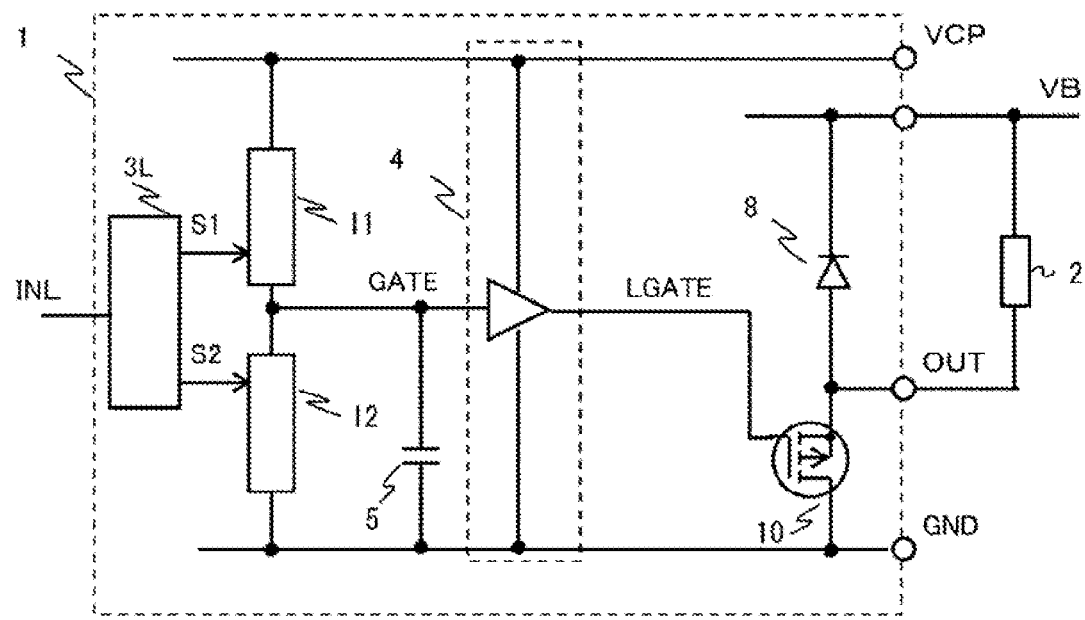
FIG. 9 is a block diagram illustrating the configuration of the load drive slope control device in a second embodiment of the present invention.

FIG. 9 illustrates a first example of the second embodiment of the present invention, and hereinafter, the points of difference between FIG. 9 and FIG. 1 illustrating a first example of the first embodiment will be described.

The load drive slope control device 1 in FIG. 9 includes the power supply terminal VB; the load 2 which is a drive target; a low-side drive PMOS transistor 10 that is connected across the GND terminal and the load 2; the pre-driver 4 that drives the gate of the low-side drive transistor 10; the capacitor 5 that is connected to the input GATE of the pre-driver 4; the first current source I1 that is ON/OFF controlled by the first signal S1, and generates current which is charged to the capacitor 5 connected to the input GATE of the pre-driver 4; and the second current source I2 that is ON/OFF controlled by the second signal S2, and generates current for discharging the capacitor 5 connected to the input GATE of the pre-driver 4.

In response to the turning on of the input signal INL, a current source control unit 3L turns off the current source I1 that is ON/OFF controlled by the signal S1, and turns on the current source I2 that is ON/OFF controlled by the signal S2.

When the capacitor 5 connected to the input GATE of the pre-driver 4 is discharged to a current value of Is2, the descending gradient of the input GATE voltage of the pre-driver becomes −Is2/C. An element with a capacitance value of C and voltage dependence lower than the voltage dependence of the gate capacitance of the low-side drive PMOS transistor 10 is used as the capacitor 5.

Similar to FIG. 1, the pre-driver 4 has a characteristic such that the input GATE voltage and an output LGATE voltage have a linear relationship, and for example, the gain of the pre-driver 4 is 1.

In this case, the descending gradient of an output LGATE voltage of the pre-driver becomes −Is2/C, and the gate voltage of the low-side drive PMOS transistor 10 is controlled such that the low-side drive PMOS transistor 10 is turned on.

In response to the turning off of the input signal INL, the current source control unit 3L turns on the current source I1 via the signal S1, and turns off the current source I2 via the signal S2, and the capacitor 5 connected to the input GATE of the pre-driver 4 is charged to a current value of Is1, and thus the gradients of the input GATE voltage and the output LGATE voltage of the pre-driver become Is1/C. The gate voltage of the low-side drive PMOS transistor 10 is controlled such that the low-side drive PMOS transistor 10 is turned off.

Since the voltage of the output terminal OUT (which is connected to the load 2) of the low-side drive PMOS transistor 10 and the LGATE voltage (which is a gate voltage) are components of a source follower circuit or a grounded drain amplifier circuit, the gain is 1. When the low-side drive PMOS transistor 10 is turned on, the gradient of the output voltage OUT becomes −Is2/C, and when the low-side drive PMOS transistor 10 is turned off, the gradient becomes Is1/C.

In a first example of the second embodiment illustrated in FIG. 9, an operation when the load 2 is a solenoid or an inductor will be described with reference to a timing chart in FIG. 10.

In the timing chart given as an example in the embodiment, a period for which the input signal INL is turned on is referred to as a low-side ON period, and a period for which the input signal INL is turned off is referred to as a low-side OFF period.

When the low-side ON period transitions to the low-side OFF period, the low-side drive PMOS transistor 10 is turned off. At this time, a flyback voltage occurs across the load 2, and current flows from the output terminal OUT to the power supply voltage VB due to the diode 8, and thus when the effect of a leak current is ignored, the output terminal OUT voltage becomes a voltage that is obtained by adding the forward voltage VOFF to the power supply voltage VB.

Since the gate-to-source voltage of the low-side drive PMOS transistor 10 depends on device characteristics in the range of a voltage which is less than or equal to a threshold voltage Vthp, the LGATE voltage required to completely turn off the low-side drive PMOS transistor 10 preferably satisfies the following expression: LGATE voltage=output terminal OUT voltage=VB+VOFF>VB, which is not a prerequisite. At this time, in FIG. 9, the pre-driver 4 is desired to have a reference potential which is greater than or equal to that of the power supply terminal VB, and is an electric potential at a VCP terminal.

Figure 10:
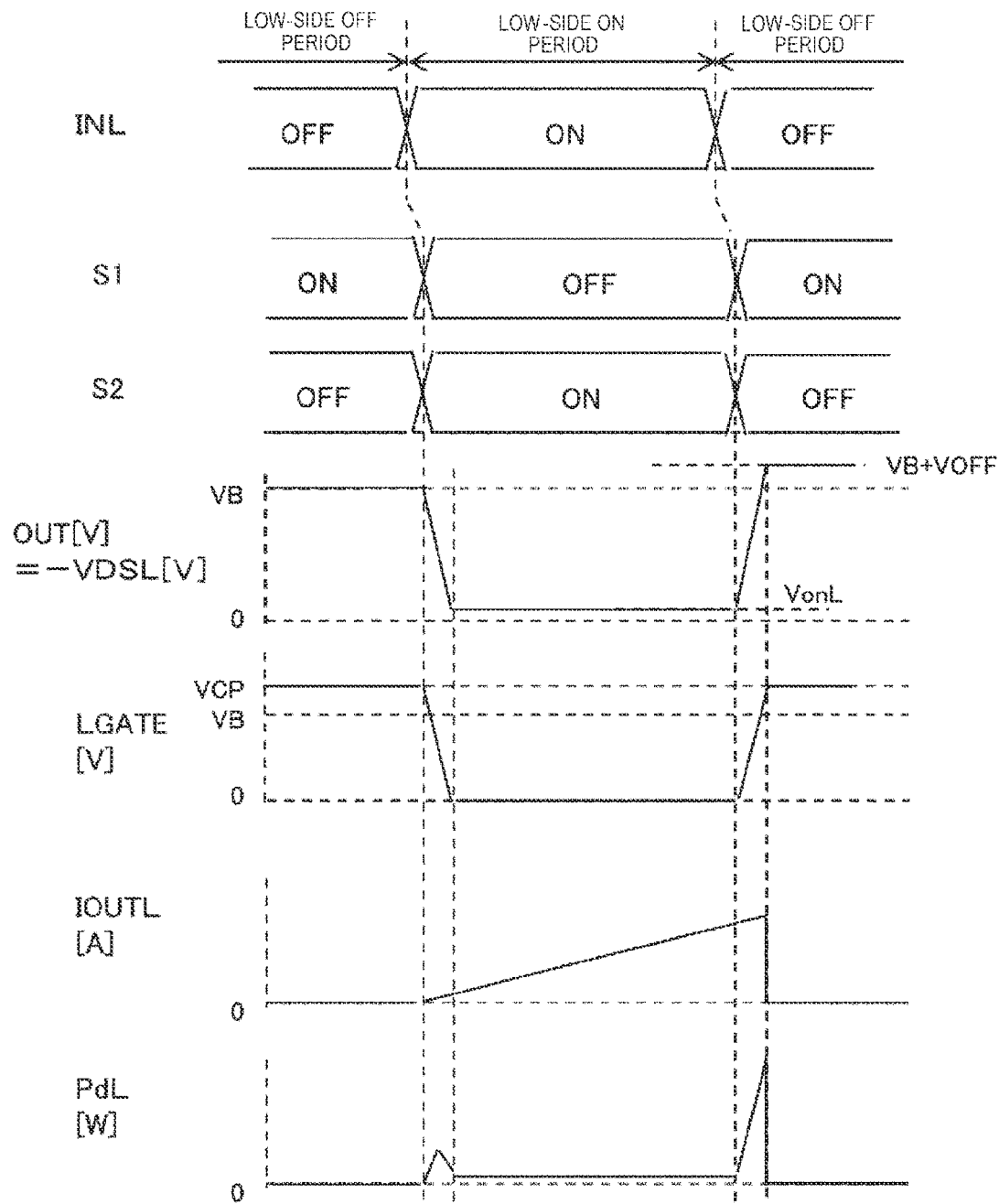
FIG. 10 is a timing chart in the example illustrated in FIG. 9.

The source-to-drain voltage waveform of the low-side drive PMOS transistor 10 has linear ascending and descending gradients as illustrated by OUT=−VDSL in FIG. 10. Accordingly, power loss PdL (=IOUTL×(−VDSL) when the low-side drive PMOS transistor 10 is turned on and off can be reduced to the minimum amount of loss in a high-frequency characteristic of EMI noise which is characterized by the f2 frequency in FIG. 4(b), and it is possible to prevent heat generation associated with power loss.

In the configuration illustrated in FIG. 9, a flyback voltage occurs across the load 2, and current flows from the output terminal OUT to the power supply terminal VB due to the diode 8; however, similar to the configuration in which the high-side driver transistor is used in FIG. 8, the circuit may be configured to perform synchronous rectification without the diode 8 being installed.

FIG. 11 illustrates a second example of the second embodiment of the present invention, and hereinafter, the points of difference between FIG. 11 and FIG. 9 illustrating the first example of the second embodiment will be described.

The load drive slope control device 1 illustrated in FIG. 11 includes the power supply terminal VB; the load 2 which is a drive target; the low-side drive NMOS transistor 10 that is connected across the GND terminal and the load 2; a pre-driver 4L that drives the gate of the low-side drive NMOS transistor 10; the capacitor 5 that is connected to the input GATE of the pre-driver 4L; the first current source I1 that is ON/OFF controlled by the first signal S1, and generates current which is charged to the capacitor 5 connected to the input GATE of the pre-driver 4L; and the second current source I2 that is ON/OFF controlled by the second signal S2, and generates current for discharging the capacitor 5 connected to the input GATE of the pre-driver 4L.

The pre-driver 4L is formed by an operational amplifier circuit, and the drain voltage of the low-side drive NMOS transistor 10 is fed back to the pre-driver 4L.

Since a drain terminal of the low-side drive NMOS transistor 10 has the same electric potential as the voltage of the output terminal OUT connected to the load 2, and a voltage is fed back to the drain terminal via the pre-driver 4L which is an operational amplifier, similar to an input GATE signal of the pre-driver 4L, when the low-side drive NMOS transistor 10 is turned on, the gradient of the output terminal OUT voltage is −Is2/C, and when the low-side drive NMOS transistor 10 is turned off, the gradient of the output terminal OUT voltage is Is1/C.

In the second example of the second embodiment illustrated in FIG. 11, an operation when the load 2 is a solenoid or an inductor will be described with reference to a timing chart in FIG. 12.

When the low-side ON period transitions to the low-side OFF period, the low-side drive NMOS transistor 10 is turned off. At this time, a flyback voltage occurs across the load 2, and current flows from the output terminal OUT to the power supply voltage VB due to the diode 8, and thus when the effect of a leak current is ignored, the output terminal OUT voltage becomes a voltage that is obtained by adding the forward voltage VOFF to the power supply voltage VB.

Figure 12:
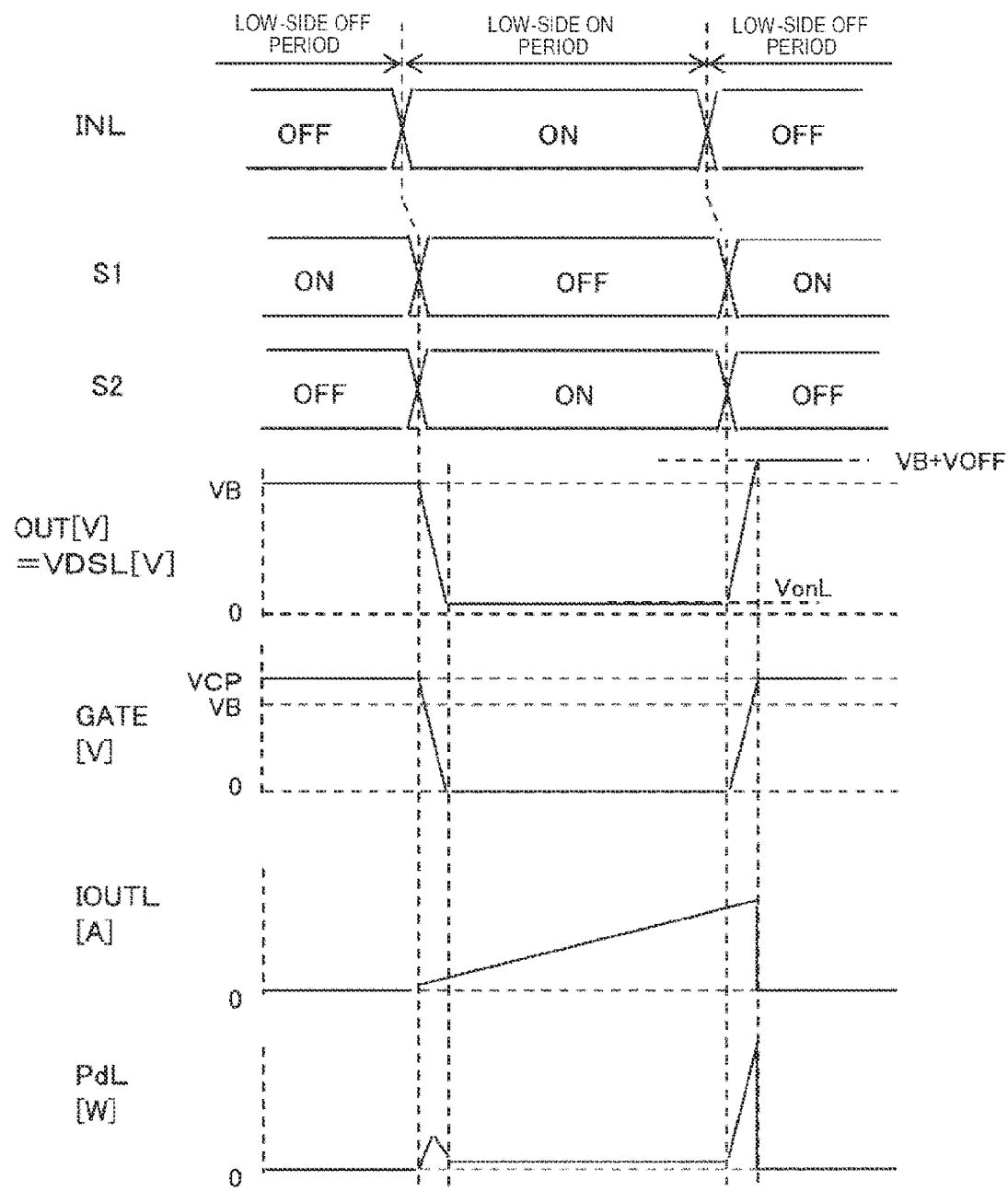
FIG. 12 is a timing chart in the example illustrated in FIG. 11.

The drain-to-source voltage waveform of the low-side drive NMOS transistor 10 has linear ascending and descending gradients as illustrated by OUT=VDSL in FIG. 12. Accordingly, power loss PdL (=IOUTL×VDSL) when the low-side drive NMOS transistor 10 is turned on and off can be reduced to the minimum amount of loss in a high-frequency characteristic of EMI noise which is characterized by the f2 frequency in FIG. 4(b), and it is possible to prevent heat generation associated with power loss.

In the configuration illustrated in FIG. 11, a flyback voltage occurs across the load 2, and current flows from the output terminal OUT to the power supply terminal VB due to the diode 8; however, similar to the configuration in which the high-side driver transistor is used in FIG. 8, the circuit may be configured to perform synchronous rectification without the diode 8 being installed.

Third Embodiment

In a third embodiment of the present invention, the configuration and the operation of the load drive slope control device which reduces EMI noise when temperature is not excessively high, and prevents excessive high temperature-induced damage to a drive transistor at an excessive high temperature will be described.

FIG. 13 illustrates a first example of the third embodiment of the present invention, and hereinafter, the points of difference between FIG. 13 and FIG. 1 illustrating the first example of the first embodiment will be described.

In FIG. 13, the load drive slope control device includes a function of changing the amount of current of the first current source I1 and the second current source I2 via a current-amount control signal ICON, and includes a temperature monitoring unit 11, and a current-amount control signal generating unit 12 that correlates an output signal TEMP from the temperature monitoring unit 11 with the current-amount control signal ICON.

As described in the first embodiment, for example, when the amount of current of the current sources I1 and I2, that is, Is1 and Is2 are equal to I, the ascending and descending gradients of the output terminal OUT voltage waveform when the high-side drive NMOS transistor 7 is turned on and off are I/C and −I/C, respectively.

When a period is T, power loss PdH when the high-side drive NMOS transistor 7 is turned on or off satisfies the following expression: PdH=IH×(VB+VOFF)/2×(dt/T)×2. Here, a drive current to the high-side drive NMOS transistor 7 is IH, and the amount of decrease in a forward voltage due to the diode 8 when a flyback voltage occurs across the load 2 is VOFF. When a flyback voltage does not occur across the load 2, VOFF is equal to 0 V. dt is a time for the ascending and the descending of an OUT voltage when the high-side drive NMOS transistor 7 is switched from turn-off to turn-on or from turn-on to turn-off.

dt=(VB+VOFF)/(I/C)=(VB+VOFF)×C/I. Accordingly, PdH=(IH×(VB+VOFF)^2)/T×(C/I).

Figure 4A:
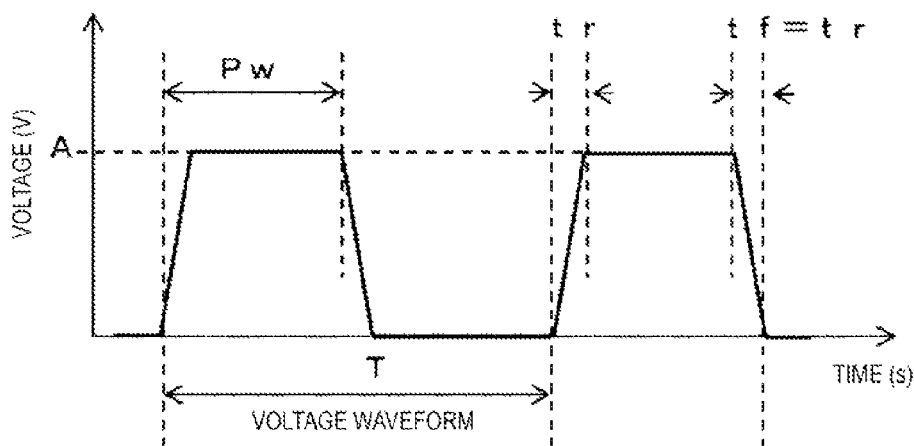
FIG. 4A is a graph illustrating a relationship between a voltage waveform and a frequency spectrum.
Figure 4B:
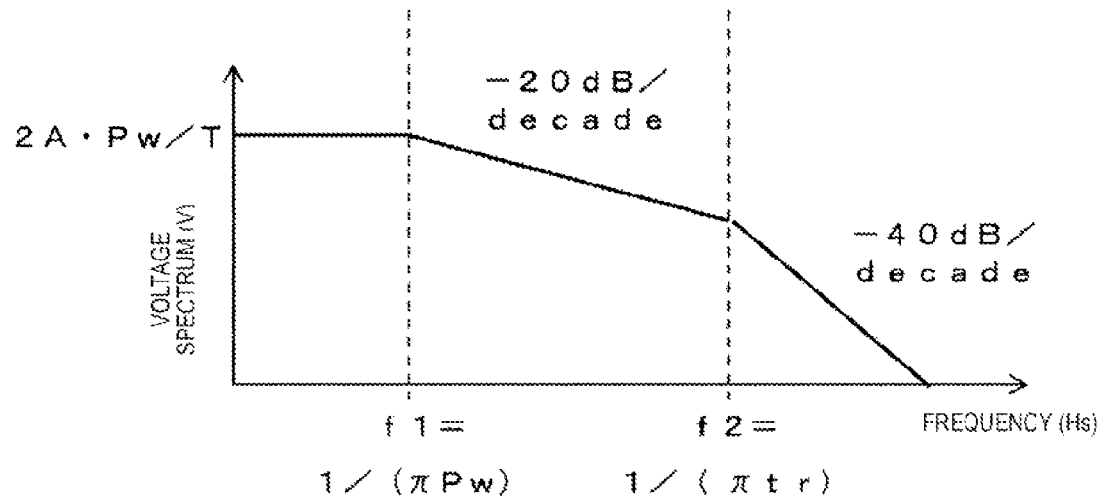
FIG. 4B is a graph illustrating a relationship between a voltage waveform and a frequency spectrum.

As such, when the amounts of current of the first current source I1 and the second current source I2 are changed via the current-amount control signal ICON, for example, the amounts of current Is1 and Is2 are set to be equal to I, and I is increased, the gradient of the output terminal OUT voltage waveform is increased, the f2 frequency in FIG. 4(b) is increased, and EMI noise in a high-frequency area is increased. In contrast, the time dt for the ascending and the descending of the output terminal OUT voltage is reduced, and the power loss PdH can also be reduced.

Figure 16A:
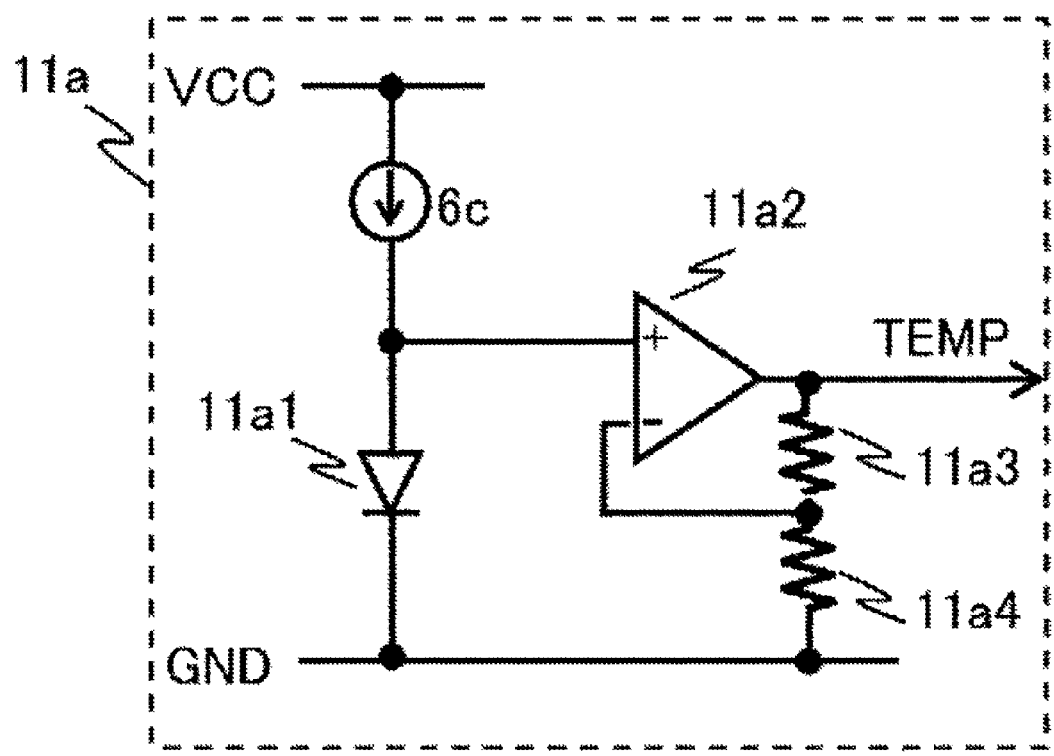
FIG. 16A is an example of a temperature monitoring unit in the example illustrated in FIG. 13.
Figure 16B:
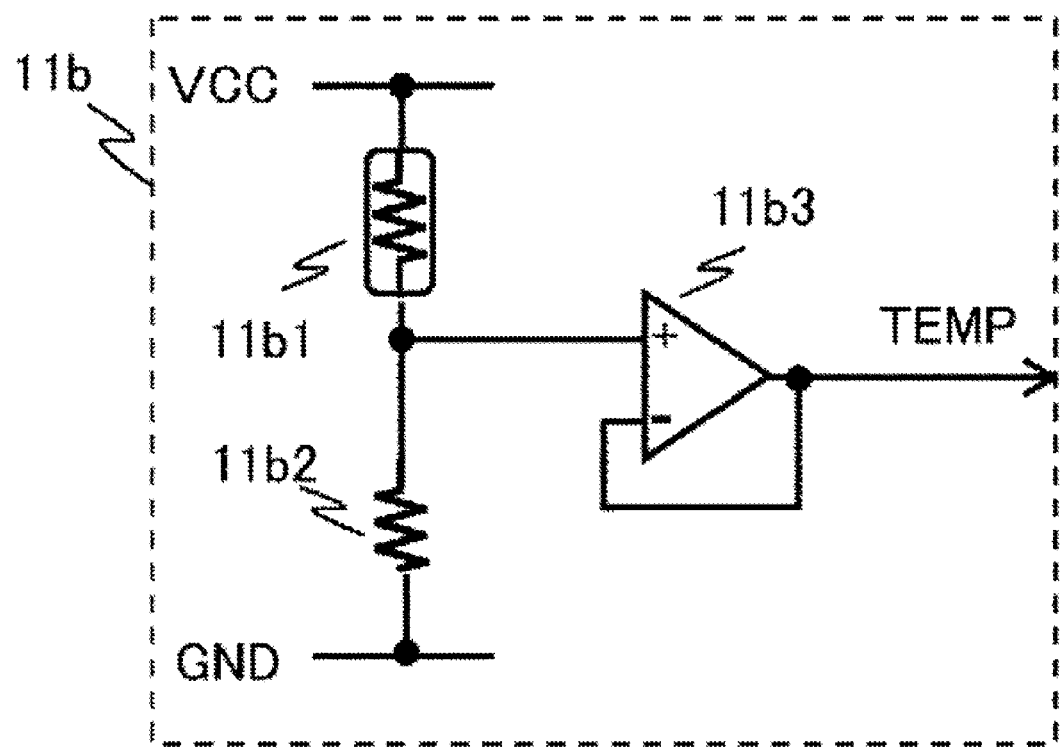
FIG. 16B is an example of a temperature monitoring unit in the example illustrated in FIG. 13.
Figure 17:
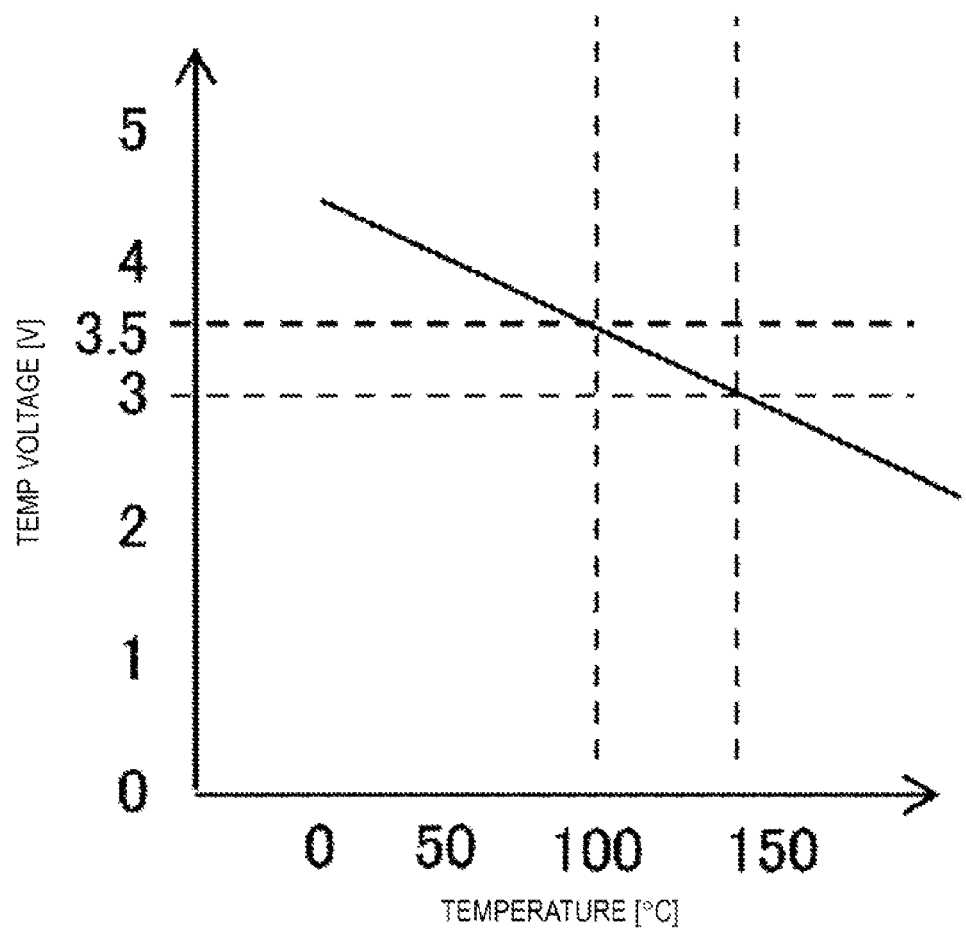
FIG. 17 is a graph illustrating an example of a characteristic of the temperature monitoring unit illustrated in FIG. 16(a).

For example, as illustrated in FIG. 16(a), the temperature monitoring unit 11 applies a constant current source 6c to a diode 11a1, and outputs a change in the forward voltage of the diode over temperature as a TEMP voltage via an amplifier circuit that is configured to include an operational amplifier 11a2 and resistors 11a3 and 11a4, and thus as illustrated in FIG. 17, the temperature monitoring unit 11 can monitor temperature. For example, as illustrated in FIG. 16(b), the temperature monitoring unit 11 may output a change in the resistance value of a thermistor 11b1 over temperature as the TEMP voltage using a voltage follower circuit that is configured to include a resistor 11b2 and an operational amplifier 11b3.

The current-amount control signal generating unit 12 receives a temperature information signal TEMP, and generates the current-amount control signal ICON. Hereinafter, the configuration and the operation of the current-amount control signal generating unit 12 will be described.

Figure 18:
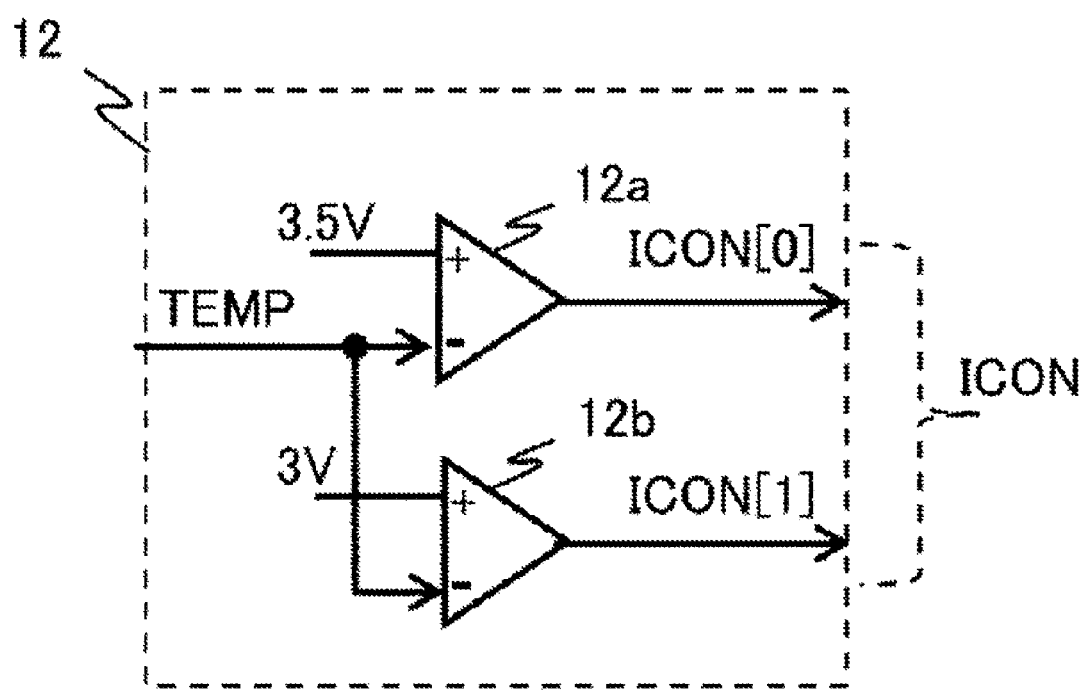
FIG. 18 is an example of a current-amount control signal generating unit illustrated in FIG. 13.

As illustrated in FIG. 18, with respect to the input signal TEMP as illustrated in FIG. 17, the current-amount control signal generating unit 12 sets 3.5V and 3V as threshold voltages using comparators 12a and 12b in response to 100° C. and 150° C. When temperature is less than or equal to 100° C., the current-amount control signal ICON (for example, which is supposed to be a 2-bit signal) which is an output signal is LL, when temperature is in a range from 100° C. to 150° C., the current-amount control signal ICON is LH, and when temperature is greater than or equal to 150° C., the current-amount control signal ICON is HH. The threshold value may have hysteresis such as a L-to-H switching threshold voltage and a H-to-L switching threshold voltage of the current-amount control signals ICON which are output signals from the comparators 12a and 12b.

Figure 15A:
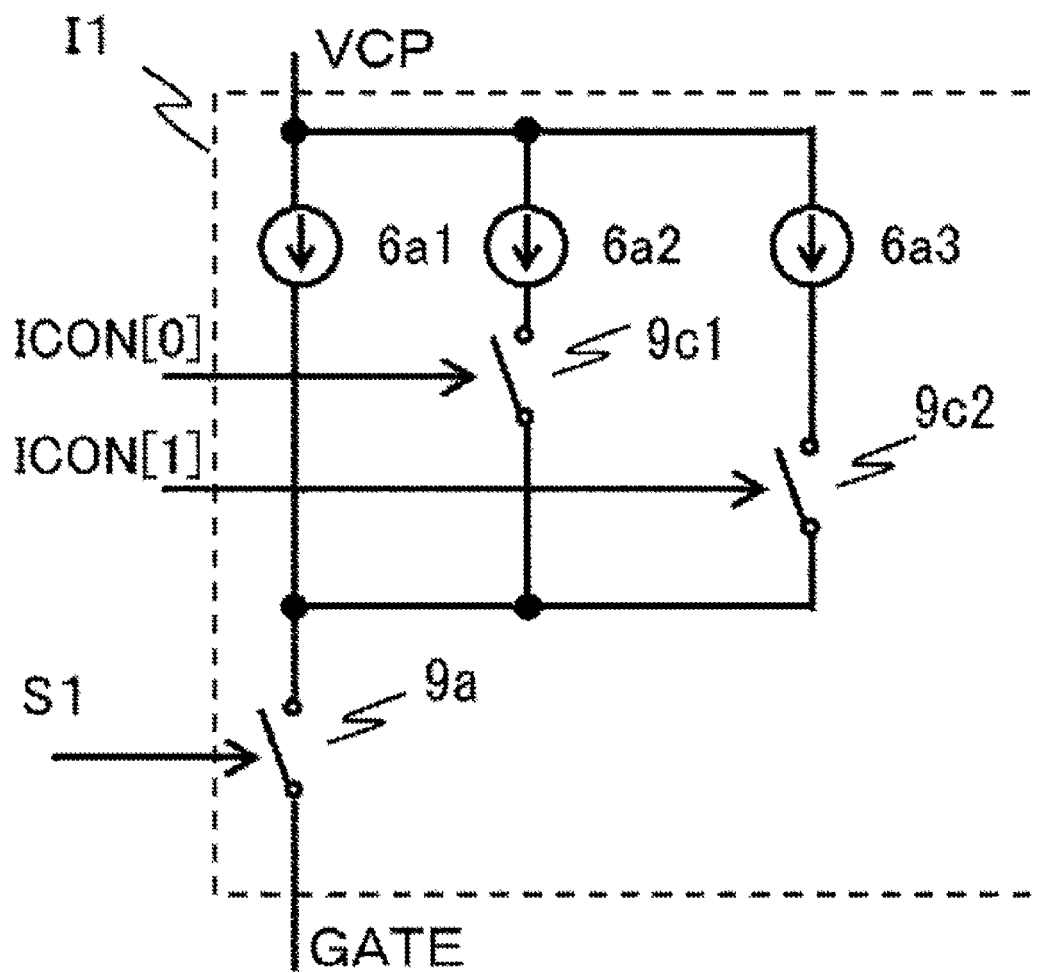
FIG. 15A is an example of a current source in the example illustrated in FIG. 13.

For example, as illustrated in FIG. 15(a), the current source I1 is configured to include the switch 9a that is turned on and off by the signal S1; a switch 9c1 that is turned off when a low 1-bit signal ICON [0] of the current-amount control signal ICON is L, and is turned on when the low 1-bit signal ICON [0] of the current-amount control signal ICON is H; a switch 9c2 that is turned off when a high 1-bit signal ICON [1] of the current-amount control signal ICON is L, and is turned on when the high 1-bit signal ICON [1] of the current-amount control signal ICON is H; and constant current sources 6a1, 6a2, and 6a3 which have current values Is, Is, and 2Is, respectively.

Figure 15B:
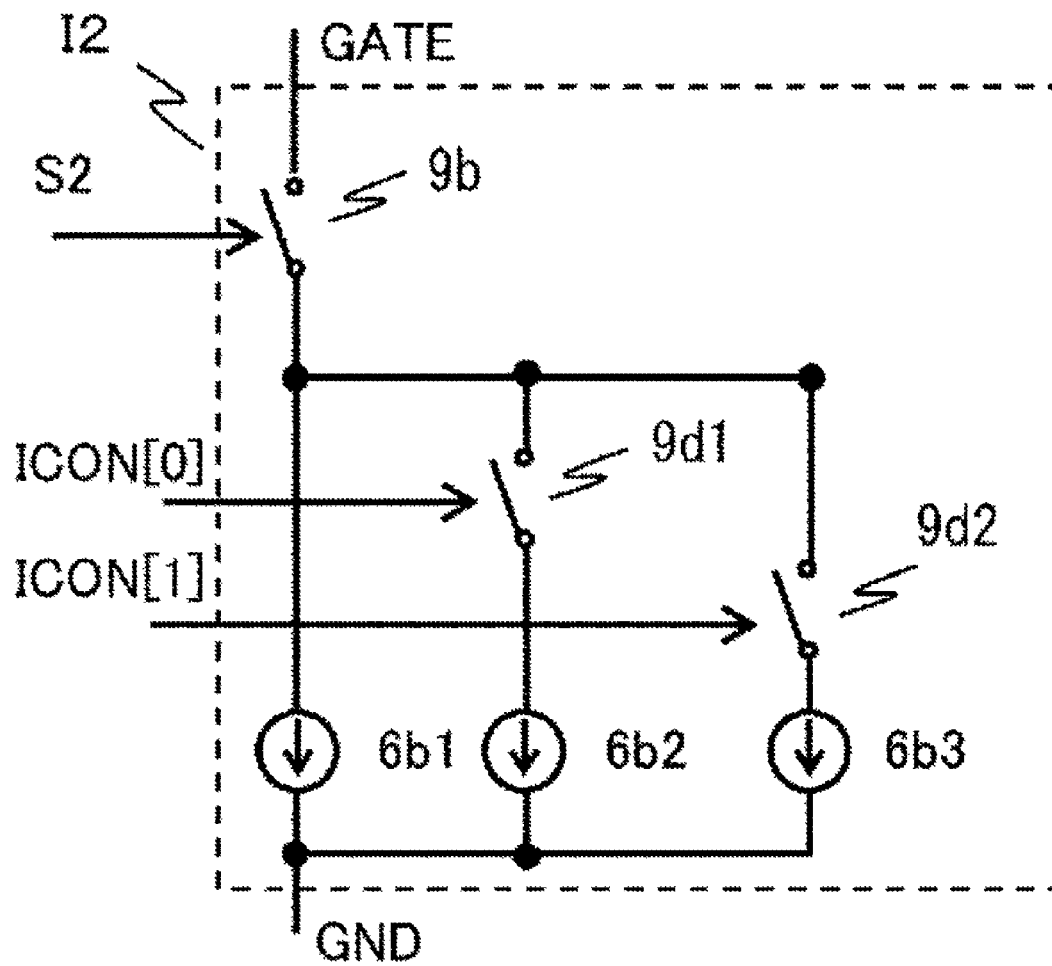
FIG. 15B is an example of a current source in the example illustrated in FIG. 13.

Similarly, for example, as illustrated in FIG. 15(b), the current source I2 is configured to include the switch 9b that is turned on and off by the signal S2; a switch 9d1 that is turned off when a low 1-bit signal ICON [0] of the current-amount control signal ICON is L, and is turned on when the low 1-bit signal ICON [0] of the current-amount control signal ICON is H; a switch 9d2 that is turned off when a high 1-bit signal ICON [1] of the current-amount control signal ICON is L, and is turned on when the high 1-bit signal ICON [1] of the current-amount control signal ICON is H; and constant current sources 6b1, 6b2, and 6b3 which have current values Is, Is, and 2Is, respectively.

For example, in a case where the amounts of current of the first current source I1 and the second current source I2, that is, Is1 and Is2 are equal to I, and H and L of the 2-bit current-amount control signal ICON are described as ICON [1] and ICON[0], via the temperature information signal TEMP to the current-amount control signal ICON, it is possible to correlate the amounts of current of the current sources I1 and I2 with I=Is at ICON=LL, I=2Is at ICON=LH, and I=4Is at ICON=HH.

Figure 19:
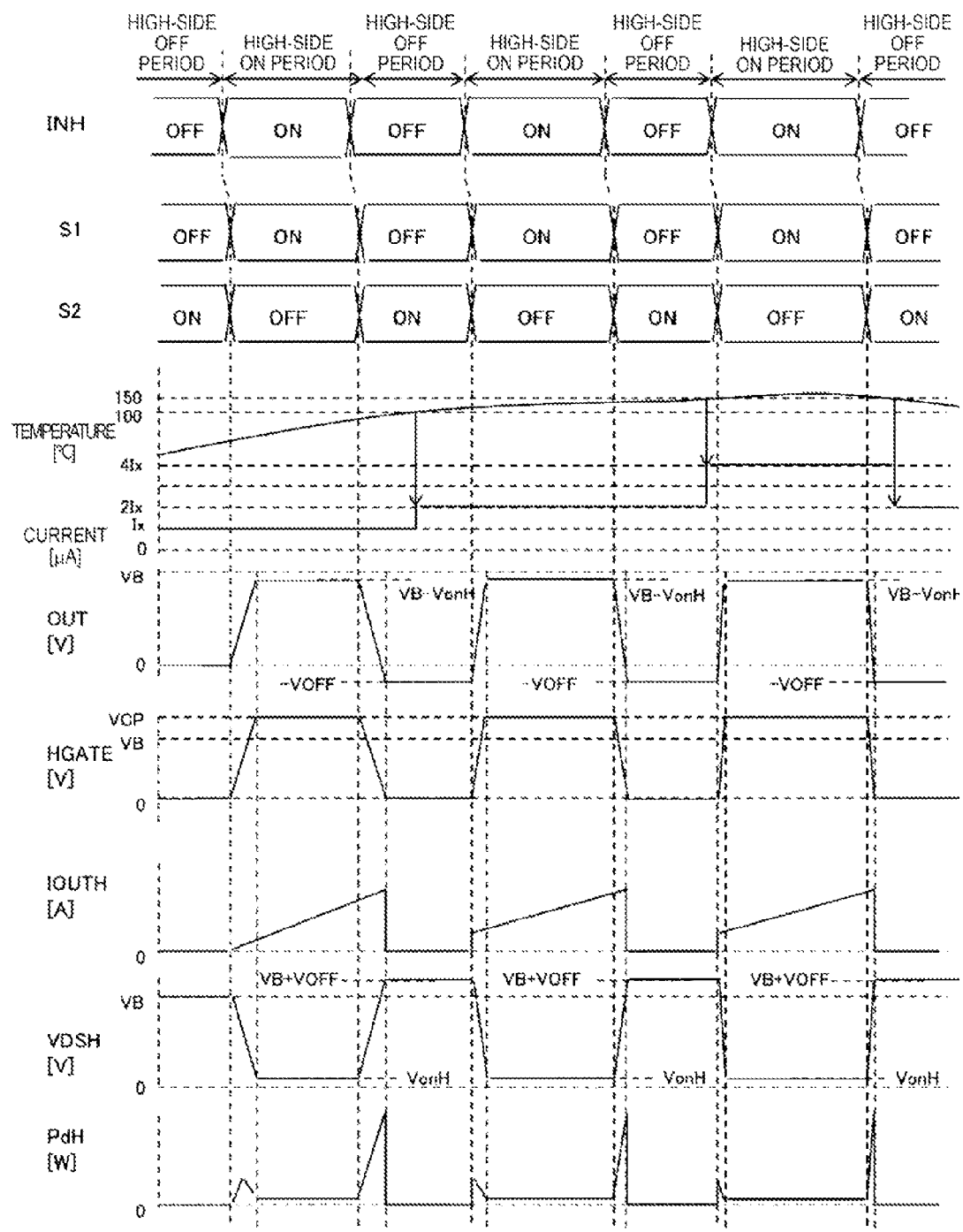
FIG. 19 is a timing chart in the example illustrated in FIG. 13.

As an example of an operation in this case, an example of a timing chart is illustrated in FIG. 19.

Since the amounts of current of the current source I1 and the current source I2 are increased in increments of Is→2Is→4Is along with an increase in temperature, it is possible to reduce the power loss PdH induced by the high-side drive NMOS transistor 7, and heat generation associated with the power loss PdH by reducing the time dt for the ascending and the descending of the output terminal OUT voltage at a high temperature.

As such, it is possible to prevent the high-side drive NMOS transistor 7 from generating heat, and excessive high temperature-induced damage to the high-side drive NMOS transistor 7.

Figure 14:
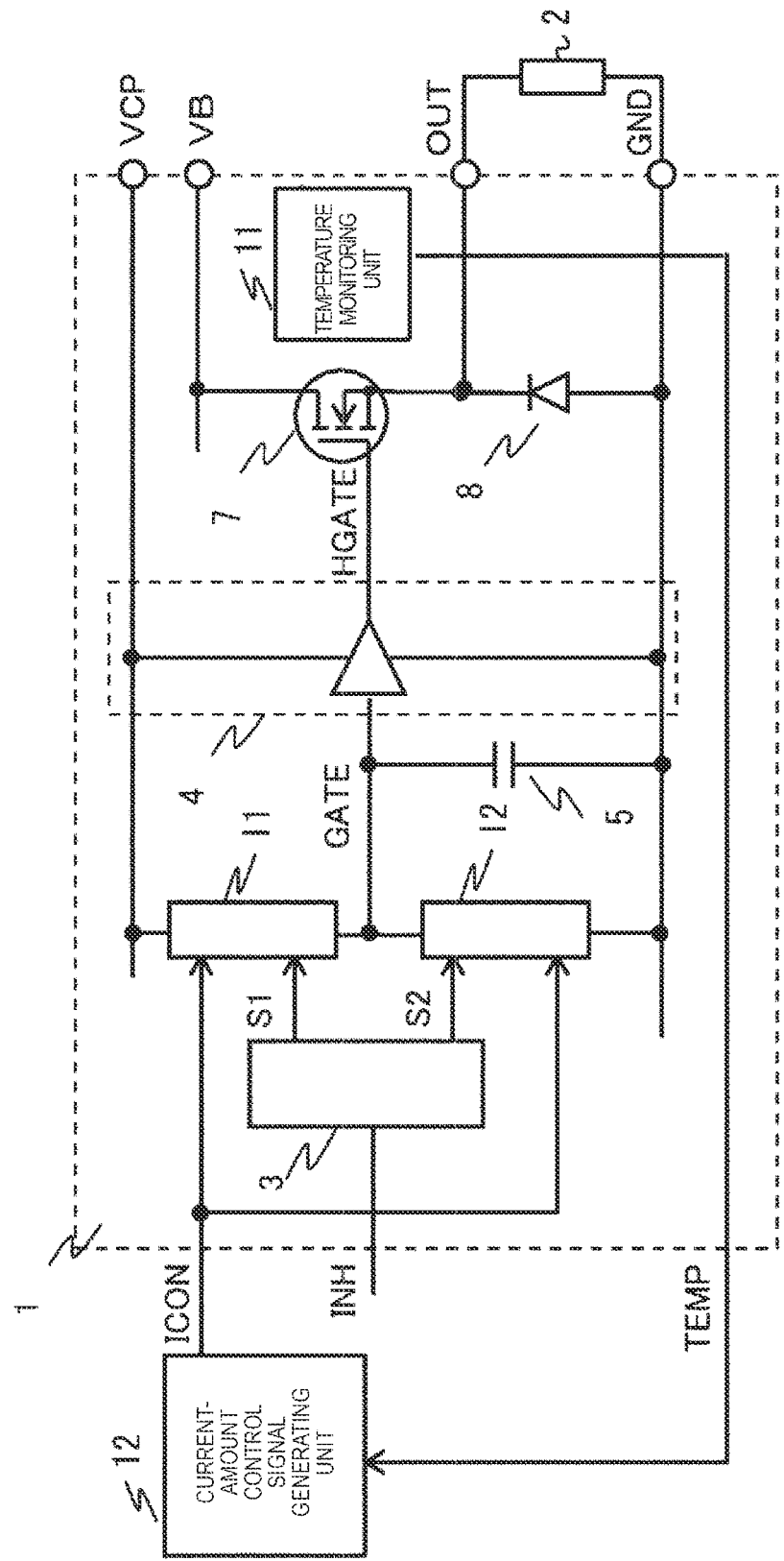
FIG. 14 is an example which is another form of the example illustrated in FIG. 13.

As illustrated in FIG. 14, it is possible to prevent the high-side drive NMOS transistor 7 from locally generating excessive heat, and prevent excessive high temperature-induced damage to the high-side drive NMOS transistor 7 by disposing the temperature monitoring unit 11 in the vicinity of the high-side drive NMOS transistor 7. The vicinity of the high-side drive NMOS transistor 7 implies that the temperature monitoring unit 11 is mounted on an insulated substrate on which the high-side drive NMOS transistor 7 is mounted.

Figure 23:
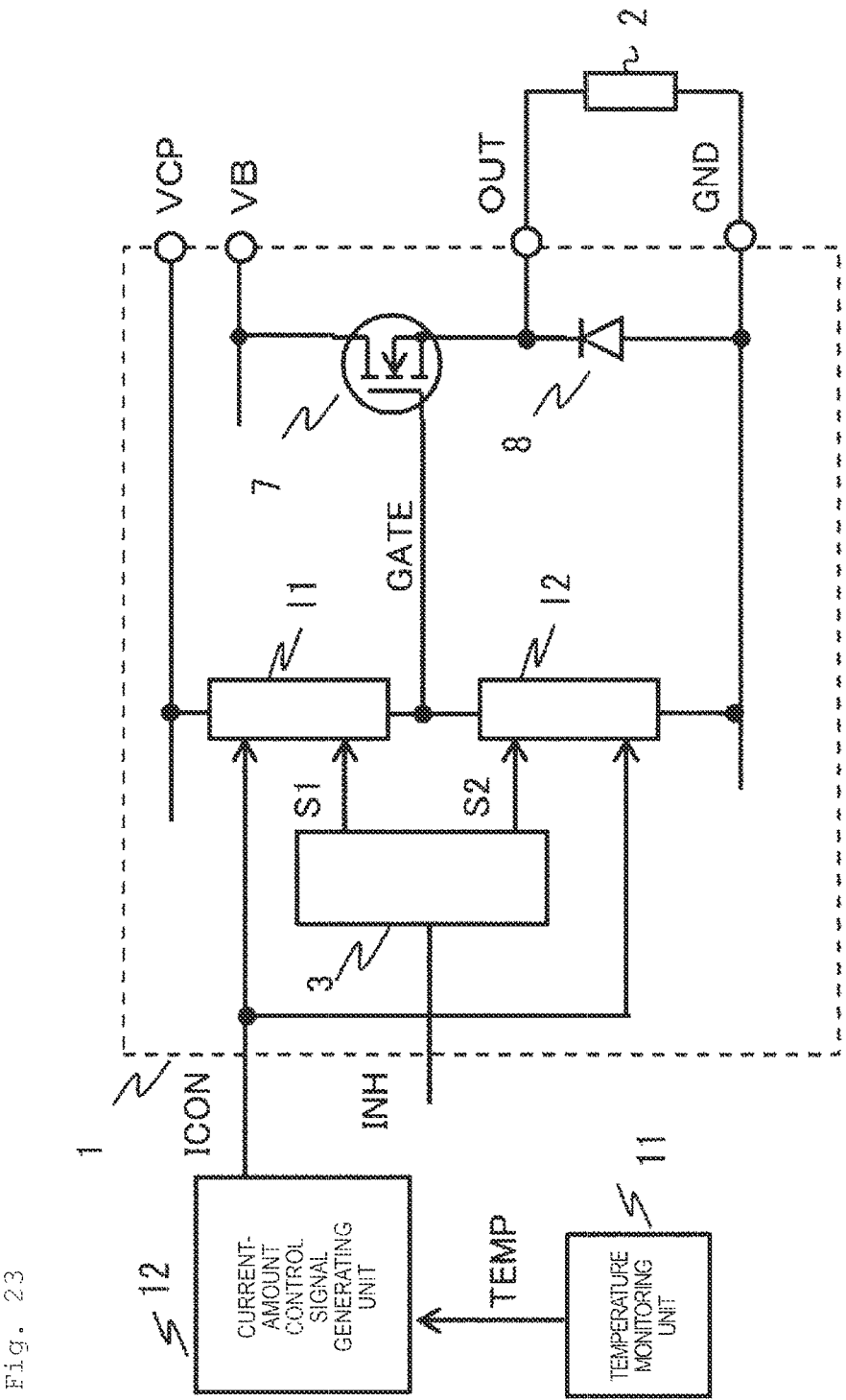
FIG. 23 is an example of the load drive slope control device in the example illustrated in FIG. 20.

FIG. 23 is a second example of the third embodiment of the present invention.

Figure 2:
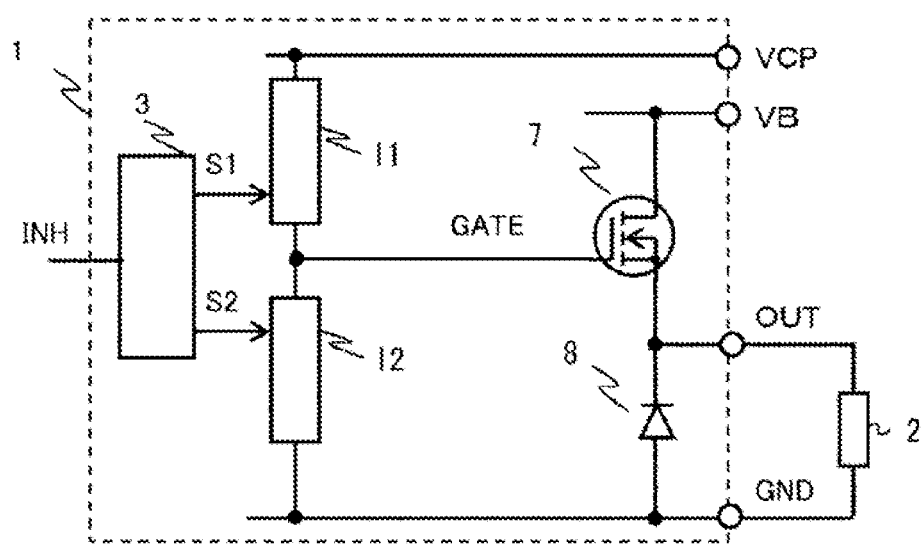
FIG. 2 is a block diagram illustrating the configuration of a load drive slope control device in the related art.
Figure 3:
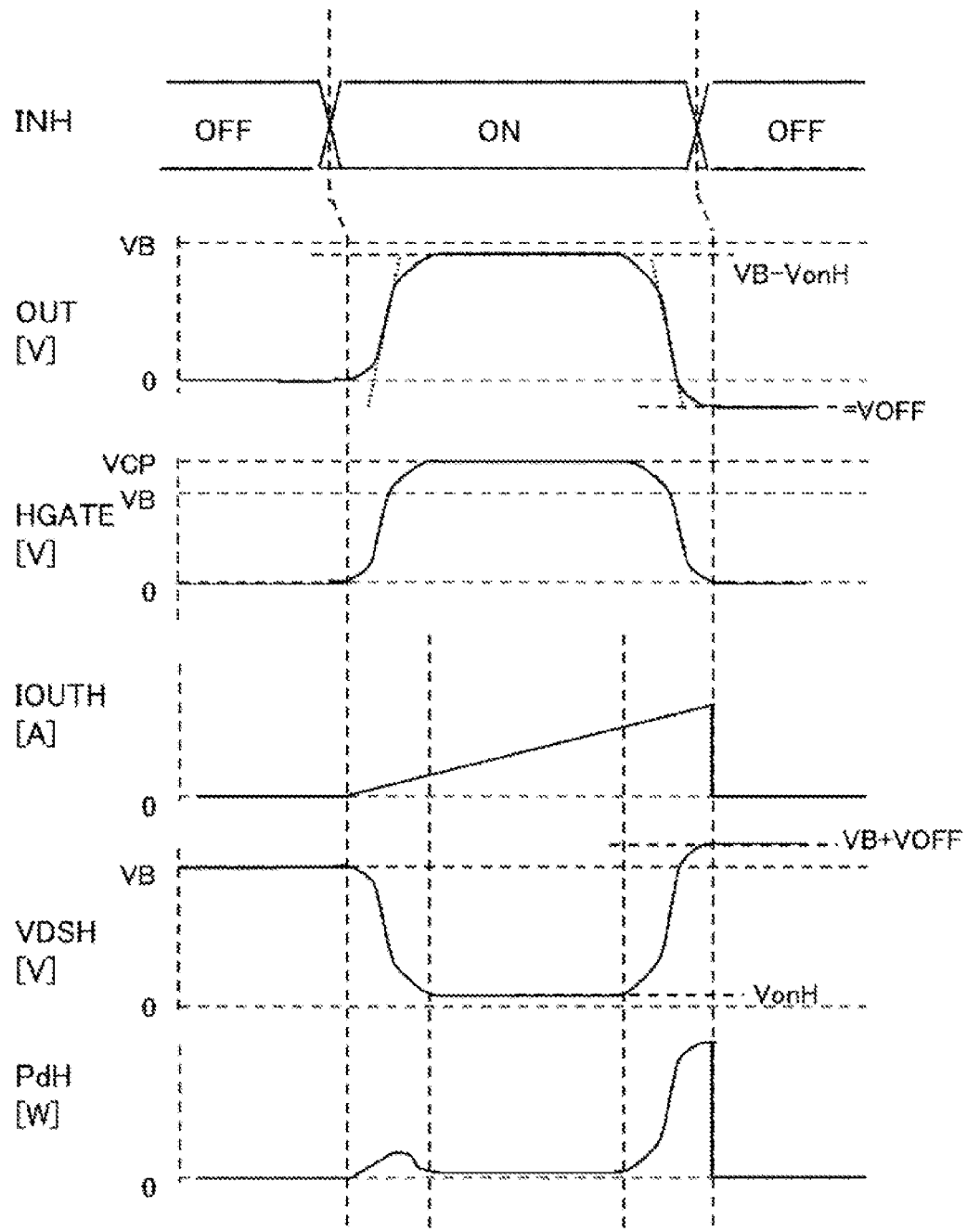
FIG. 3 is a timing chart in the example illustrated in FIG. 2.

The point of difference between FIG. 23 and FIG. 2 illustrating a first embodiment in the related art is that the load drive slope control device includes a function of changing the amounts of current of the first current source I1 and the second current source I2 via the current-amount control signal ICON, and includes the temperature monitoring unit 11 and the current-amount control signal generating unit 12 that correlates the output signal TEMP from the temperature monitoring unit 11 with the current-amount control signal ICON.

In the embodiment, differently from FIG. 13, the gate capacitance of the high-side drive NMOS transistor 7 is charged or discharged by the current sources I1 and I2. As described above, since the voltage dependence of the gate capacitance is non-linear, the power loss PdH when the high-side drive NMOS transistor 7 is turned on and off is increased compared to the embodiment in FIG. 13, and heat is generated.

However, the load drive slope control device includes the temperature monitoring unit 11, and the current-amount control signal generating unit 12 that correlates the output signal TEMP from the temperature monitoring unit 11 with the current-amount control signal ICON, and includes a function of changing the amounts of current of the first current source I1 and the second current source I2 via the current-amount control signal ICON, and thus similar to the embodiment in FIG. 13, it is possible to reduce the power loss PdH induced by the high-side drive NMOS transistor 7, and heat generation associated with the power loss PdH by reducing the time dt for the ascending and the descending of the output terminal OUT voltage at a high temperature.

As such, it is possible to prevent the high-side drive NMOS transistor 7 from generating heat, and excessive high temperature-induced damage to the high-side drive NMOS transistor 7.

Figure 24:
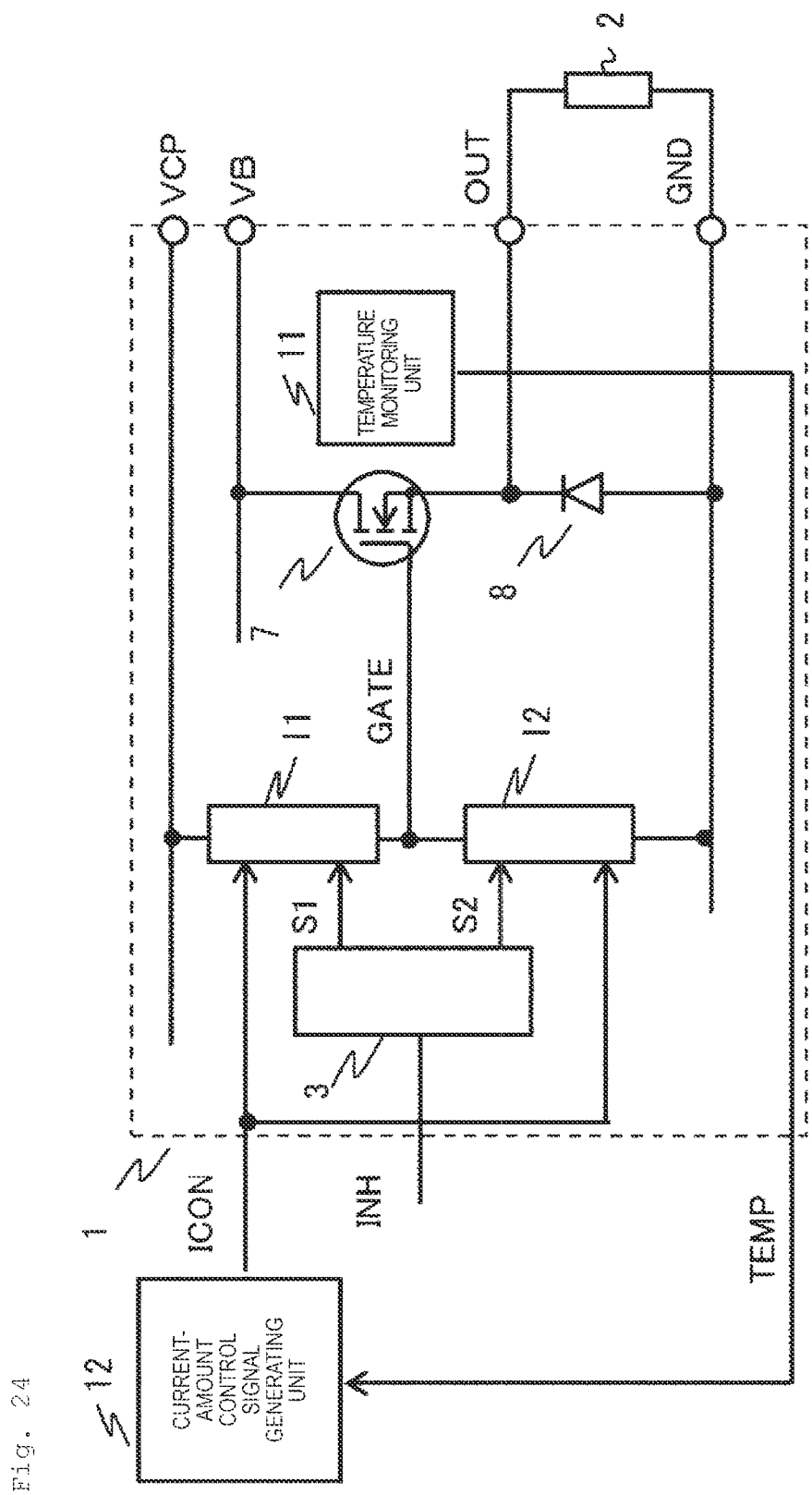
FIG. 24 is an example of the load drive slope control device in the example illustrated in FIG. 21.

As illustrated in FIG. 24, it is possible to prevent the high-side drive NMOS transistor 7 from locally generating excessive heat, and prevent excessive high temperature-induced damage to the high-side drive NMOS transistor 7 by disposing the temperature monitoring unit 11 in the vicinity of the high-side drive NMOS transistor 7. The vicinity of the high-side drive NMOS transistor 7 implies that the temperature monitoring unit 11 is mounted on an insulated substrate on which the high-side drive NMOS transistor 7 is mounted.

Fourth Embodiment

Figure 20:
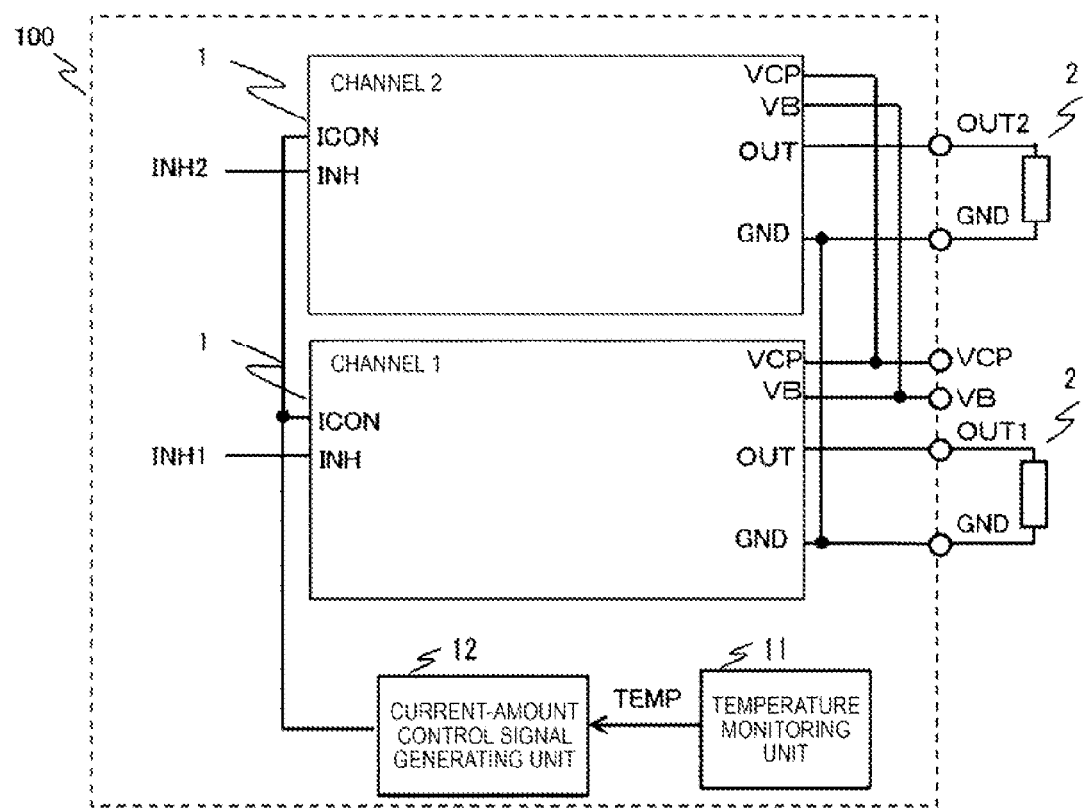
FIG. 20 is a block diagram illustrating the configuration of the load drive slope control device in a fourth embodiment of the present invention.

In a fourth embodiment of the present invention, an example, in which a plurality of load drive slope control devices are integrally built, will be described, and FIG. 20 illustrates an example of the configuration of a circuit which reduces EMI noise when temperature is not excessively high, and prevents excessive high temperature-induced damage to a drive transistor at an excessive high temperature.

The load drive slope control device 1 has the current-amount control signal ICON as illustrated in FIG. 13 or FIG. 23 as an input, and an integrated circuit 100 includes the temperature monitoring unit 11 and the current-amount control signal unit 12.

When the temperature information signal TEMP from the temperature monitoring 11 indicates a high temperature, it is possible to reduce the power loss PdH induced by the high-side drive NMOS transistor 7 of the load drive slope control device 1 for each channel, and heat generation associated with the power loss PdH by reducing the time dt for the ascending and the descending of the voltages of OUT1 and OUT2.

As such, it is possible to reduce EMI noise when temperature is not excessively high, and to prevent the high-side drive NMOS transistor 7 from generating heat, and excessive high temperature-induced damage to the high-side drive NMOS transistor 7.

Fifth Embodiment

Figure 21:
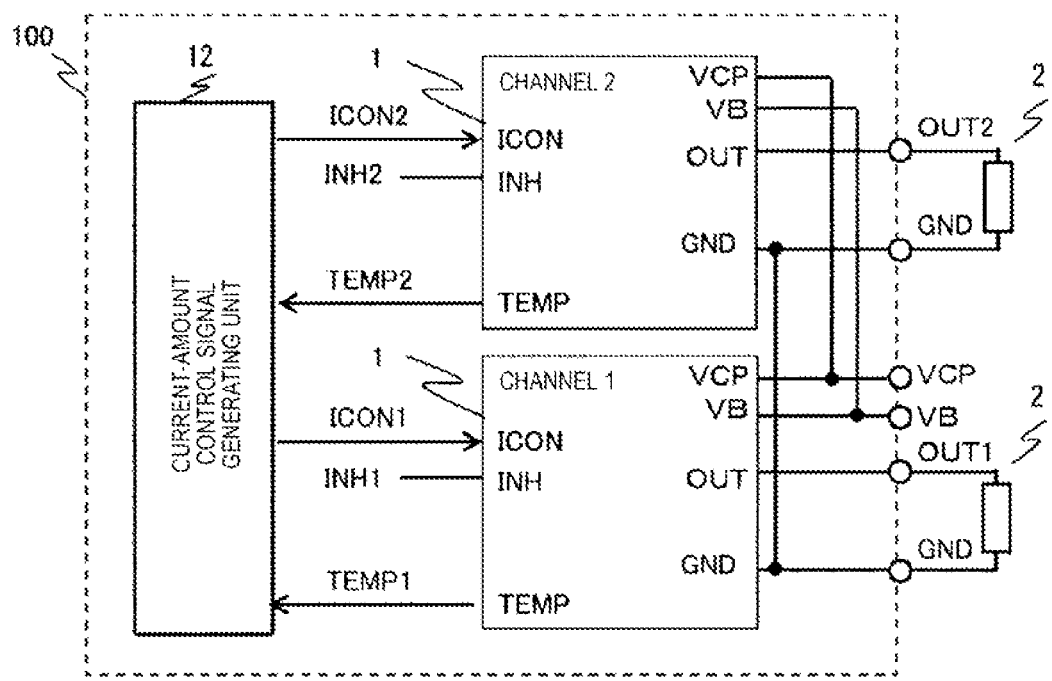
FIG. 21 is a block diagram illustrating the configuration of the load drive slope control device in a fifth embodiment of the present invention.

In a fifth embodiment of the present invention, an example, in which load drive slope control devices for a plurality of loads are integrally built, will be described, and FIG. 21 illustrates an example of the configuration of a circuit which reduces EMI noise when temperature is not excessively high, and prevents excessive high temperature-induced damage to a drive transistor at an excessive high temperature.

The load drive slope control device 1 is configured such that the load drive slope control device 1 has the current-amount control signal ICON as illustrated in FIG. 14 or FIG. 24 as an input, the temperature monitoring unit 11 is disposed in the vicinity of the high-side drive NMOS transistor 7, and the load drive slope control device 1 has the temperature information signal TEMP as an output signal, and the integrated circuit 100 includes the temperature monitoring unit 11 and the current-amount control signal unit 12.

When temperature information from the temperature monitoring 11 of the load drive slope control device 1 for each channel indicates a high temperature, it is possible to reduce the power loss PdH induced by the high-side drive NMOS transistor 7 of the load drive slope control device 1 for each channel, and heat generation associated with the power loss PdH by reducing the time dt for the ascending and the descending of an output terminal OUT voltage for each channel.

As such, it is possible to reduce EMI noise when temperature is not excessively high, and to prevent the high-side drive NMOS transistor 7 from generating heat, and excessive high temperature-induced damage to the high-side drive NMOS transistor 7.

Figure 22:
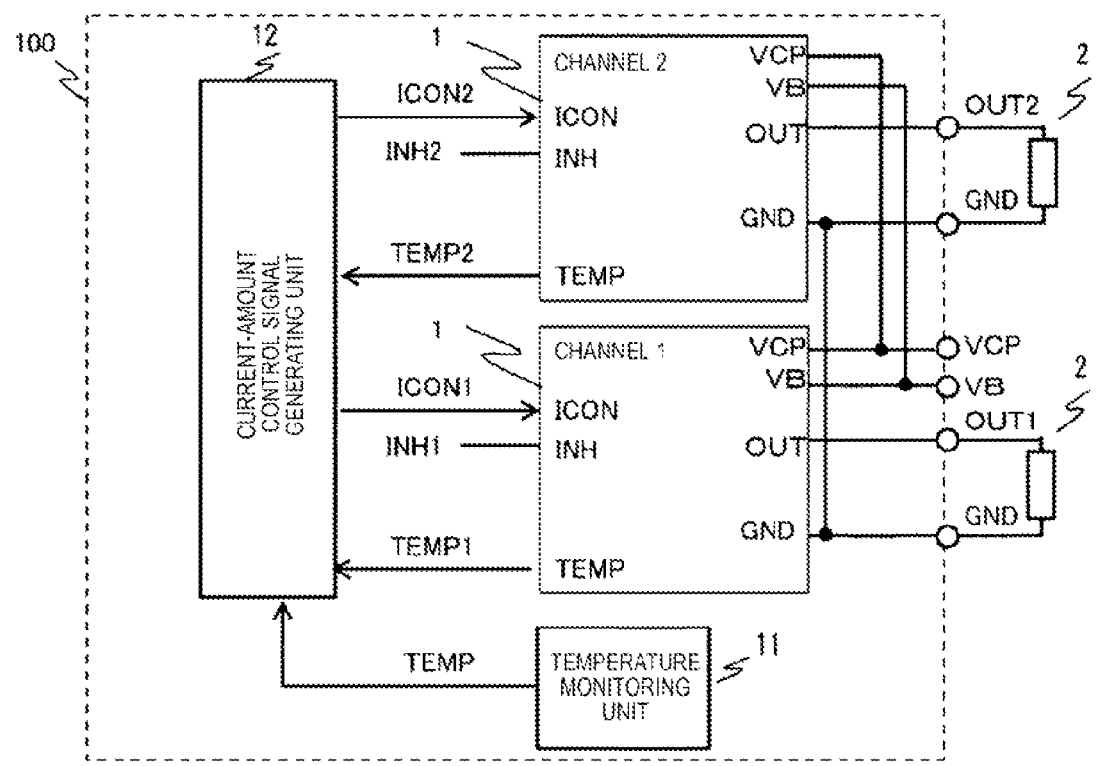
FIG. 22 is an example which is another form of the example illustrated in FIG. 21.

As illustrated in FIG. 22, the integrated circuit 100 may have the temperature monitoring unit 11 therein separate from the load drive slope control device 1 for each channel.

In the third to fifth embodiments, it is possible to reduce EMI noise when temperature is not excessively high, and to prevent a drive transistor from generating heat, and excessive high temperature-induced damage to the drive transistor at an excessive high temperature. Similar to the first embodiment, the load 2 is not limited to a solenoid or an inductor, and a load driver is not limited to a high-side driver. The input signal INH may be set to OFF, and the gate of the high-side drive NMOS transistor 7 may be turned off when a predetermined temperature (for example, 180° C.) is monitored using the temperature monitoring unit 11 so as to reliably prevent excessive high temperature-induced damage to the high-side drive NMOS transistor 7 at the predetermined temperature, which is not illustrated in the drawings.

The present invention is not limited to the aforementioned embodiments, and includes various modification examples. For example, the aforementioned embodiments have been described in detail for ease of understanding of the present invention; however, the present invention does not necessarily include all of the aforementioned elements. A portion of the elements of an embodiment can be replaced with a portion of the elements of another embodiment, and the elements of an embodiment can be added to the configuration of another embodiment. The addition, removal, or replacement of a portion of the elements of each of the embodiments can be made with respect to the configuration of the other embodiments.

Only the control lines or the signal lines deemed to be necessary for illustrative purpose are illustrated; however, all of the control lines or the signal lines needed for a product are not illustrated.

REFERENCE SIGNS LIST

1: load drive slope control device
2: load
3, 3L: current source control unit
4: pre-driver
5: capacitor
6a to 6c: constant current source
7: high-side drive transistor
8: diode
9a to 9d: switch
10: low-side drive transistor
11: temperature monitoring unit
12: current-amount control signal generating unit
13: driver
100: integrated circuit
INH, INL: input signal
S1, S2: control signal
I1 to I3: current source
ICON: current-amount control signal
TEMP: temperature information signal

The invention claimed is:
1. A load drive control device comprising:
a drive transistor that drives a load;
a pre-driver that drives the drive transistor via an ON/OFF control terminal of the drive transistor;

a capacitor that is connected to an input side of the pre-driver;

a first current source that is ON/OFF controlled by a first signal, and generates current which is charged to the capacitor; and a second current source that is ON/OFF controlled by a second signal, and generates current for discharging the capacitor, wherein an output voltage from the pre-driver is changed by charging or discharging the capacitor, wherein the amount of current of each of the first current source and the second current source can be changed by an ascending signal and a descending signal based on temperature information regarding the drive transistor, and the ascending and the descending of the signal is performed according to threshold values with hysteresis, and wherein the drive transistor is turned on and off by the output voltage from the pre-driver.

2. The load drive control device according to claim 1, wherein the drive transistor is a high-side drive transistor that is connected to a high-voltage power supply side, and drives the load.

3. The load drive control device according to claim 1, wherein the drive transistor is a low-side drive transistor that is connected to a GND side, and drives the load.

4. The load drive control device according to claim 1, wherein the pre-driver includes a voltage follower circuit that is formed by a source follower circuit, or an operational amplifier configured to include an N-type transistor and a P-type transistor.

5. The load drive control device according to claim 1, wherein a third signal including the first signal and the second signal is acquired via a common signal input terminal, and wherein the ascending gradient and the descending gradient of the waveform of a voltage driving the load are changed by changing the amounts of current of the first current source and the second current source based on the third signal.

6. The load drive control device according to claim 5, further comprising:

a temperature monitoring unit that acquires a temperature information signal for the drive transistor; and a current-amount control signal generating unit that outputs the third signal in response to the temperature information signal.

7. The load drive control device according to claim 6, wherein the temperature monitoring unit is disposed on an insulated substrate on which the drive transistor is mounted.

8. The load drive control device according to claim 5, further comprising:

a semiconductor integrated circuit in which at least the drive transistors for one or multiple channels, and the third signals for one or multiple channels are formed on the same silicon substrate.

9. The load drive control device according to claim 5, further comprising:

a semiconductor integrated circuit in which at least the drive transistors for one or multiple channels, the third signals for one or multiple channels, and the temperature monitoring unit for one or multiple channels are formed on the same silicon substrate.

10. The load drive control device according to claim 5, further comprising:

a semiconductor integrated circuit in which at least the drive transistors for one or multiple channels, and the temperature monitoring unit for one or multiple channels are formed on the same silicon substrate.

11. A load drive control device comprising:

a drive transistor that drives a load;

a first current source that generates current to be charged to a capacitance of an ON/OFF control terminal of the drive transistor by being ON/OFF controlled via a first signal;

a second current source that generates current for discharging the capacitance of the ON/OFF control terminal of the drive transistor by being ON/OFF controlled by a second signal;

a temperature monitoring unit that acquires a temperature information signal for the drive transistor; and a current-amount control signal generating unit that outputs the third signal in response to the temperature information signal, wherein the drive transistor is turned on and off by charging or discharging the capacitance of the ON/OFF control terminal of the drive transistor, and wherein an ascending gradient and a descending gradient of the waveform of a voltage driving the load are changed by changing the amounts of current of the first current source and the second current source via a third signal including the first signal and the second signal.

12. The load drive control device according to claim 11, wherein the temperature monitoring unit is disposed on an insulated substrate on which the drive transistor is mounted.

13. The load drive control device according to claim 11, further comprising:

a semiconductor integrated circuit in which at least the drive transistors for one or multiple channels, and the third signals for one or multiple channels are formed on the same silicon substrate.

14. The load drive control device according to claim 11, further comprising:

a semiconductor integrated circuit in which at least the drive transistors for one or multiple channels, the third signals for one or multiple channels, and the temperature monitoring unit for one or multiple channels are formed on the same silicon substrate.

* * * * *